(12) United States Patent
Kamp

(10) Patent No.: US 6,256,220 B1
(45) Date of Patent: Jul. 3, 2001

(54) FERROELECTRIC MEMORY WITH SHUNTED ISOLATED NODES

(75) Inventor: David A. Kamp, Monument, CO (US)

(73) Assignee: Celis Semiconductor Corporation, Colorado Springs, CO (US)

(*) Notice: Subject to any disclaimer, the term of this patent is extended or adjusted under 35 U.S.C. 154(b) by 0 days.

(21) Appl. No.: 09/508,305

(22) PCT Filed: Feb. 9, 1998

(86) PCT No.: PCT/US98/18237

§ 371 Date: Mar. 9, 2000

§ 102(e) Date: Mar. 9, 2000

(87) PCT Pub. No.: WO99/14761

PCT Pub. Date: Mar. 25, 1999

Related U.S. Application Data

(60) Continuation-in-part of application No. 09/244,619, filed on Feb. 4, 1999, which is a division of application No. 08/931,023, filed on Sep. 15, 1997, now Pat. No. 5,959,878.

(51) Int. Cl.$^7$ .................................................. G11C 11/27
(52) U.S. Cl. ...................................... 365/145; 365/189.01
(58) Field of Search ................................ 365/145, 189.01

(56) References Cited

U.S. PATENT DOCUMENTS 4,712,876  12/1987  Umeda et al. .
5,038,323  * 8/1991  Schwee ................................ 365/145

FOREIGN PATENT DOCUMENTS

| 0 702 372 A2 | 3/1996 | (EP) . |
| 08180671 | 7/1996 | (EP) . |
| 0 847 059 A2 | 6/1998 | (EP) . |

* cited by examiner

*Primary Examiner*—David Nelms
*Assistant Examiner*—M. Tran
(74) *Attorney, Agent, or Firm*—Duft, Graziano & Forest, P.C.

(57) ABSTRACT

A ferroelectric memory includes memory cells comprising a transistor having a source/drain, a ferroelectric capacitor having a first electrode and a second electrode. A plate line is connected to each of the second electrodes. In each memory cell, the first electrode is connected to the source/drain of the transistor to create a node that is isolated when the transistor is off. A shunt system directly electrically connects the isolated nodes of a pair of memory cells at a predetermined time to essentially equalize the voltages on the nodes. The shunt may be a Schottky diode, a resistor, and a pair of back-to-back diodes, or a transistor. In the embodiment in which the shunt is a transistor, the shunt line connected to the shunt transistor gate is boosted, there is a shunt transistor connecting each isolated node in a portion of the memory to the adjacent isolated node, and every eight to thirty-two isolated nodes, another shunt transistor connects the chain of isolated nodes to the plate line.

17 Claims, 12 Drawing Sheets

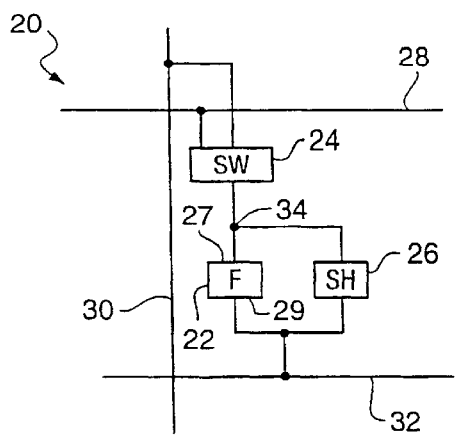
FIG. 1
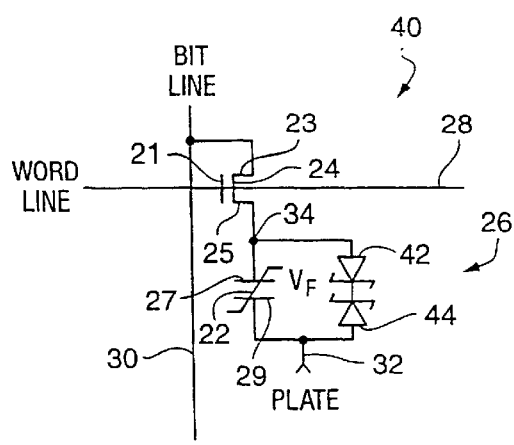
FIG. 2
FIG. 3
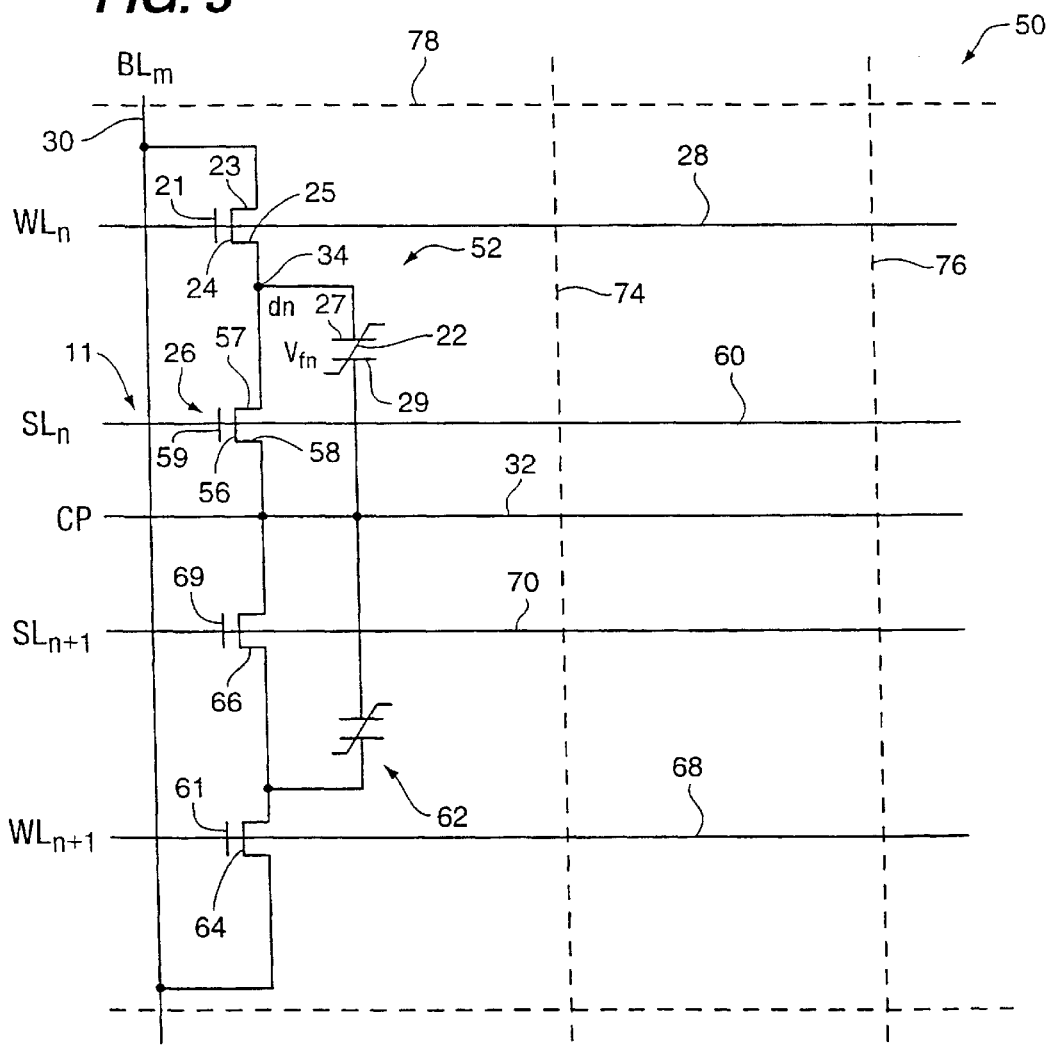

FERROELECTRIC MEMORY WITH SHUNTED ISOLATED NODES

This is a continuation-in-part of U.S. application Ser. No. 09/244,619, filed Feb. 4, 1999, which is a divisional of U.S. application Ser. No. 08/931,023, filed Sep. 15, 1997, which application issued as U.S. Pat. No. 5,959,878 on Sep. 28, 1998.

BACKGROUND OF THE INVENTION

1. Field of the Invention

The invention in general relates to the design and fabrication of ferroelectric memories, and more particularly to memory architecture that includes a shunt between the isolated nodes of adjacent ferroelectric capacitors in the memory cell which prevents undesirable switching of the ferroelectric material.

2. Statement of the Problem

Ferroelectric memories have been known for many years and offer many advantages over other memories. See U.S. Pat. No. 5,561,307, issued Oct. 1, 1996 to Takashi Mihara et al., for example. One of the most common and commercially successful ferroelectric memory designs utilizes a memory cell comprising a ferroelectric capacitor, one electrode of which is connected to a transistor, and the other electrode of which is connected to a line, conventionally called the plate line. The design and operation of a memory of this type is similar to the DRAM, thus these memories are commonly referred to as FeRAMs. There is at least one important difference between a DRAM and an FeRAM: a "read voltage" must be placed across the ferroelectric memory to read it. This difference has resulted in significant difficulties in designing an FeRAM that is as fast, failure resistant and dense as a conventional DRAM. See, for example, U.S. Pat. No. 5,406,510 issued Apr. 11, 1995 to Takashi Mihara et al.

One solution to the need for applying a voltage across the FeRAM to read it, has been to hold the plate line at a fixed (constant) voltage, usually equal to ½ the supply voltage. See U.S. Pat. No. 5,406,510 referenced above as well as U.S. Pat. No. 5,038,323 issued to Leonard J. Schwee on Aug. 6, 1991. In these designs the same plate line is connected to all or at least a portion of all memory cells, and thus is referred to as a common or cell plate line. The plate line is held at a constant voltage, which is ½ the supply voltage, Vcc. A problem with this design is that the electrical node between the capacitor and the transistor, though isolated from the rest of the circuit, tends to lose charge through various leakage paths such that the voltage on the node reaches a level different from that of the plate line. This is essentially a result of the fact that reversed-biased diodes and "off" MOSFETs have significant leakage in comparison to the leakage through the ferroelectric capacitor itself. The zero voltage of the node between the transistor and capacitor, which we will call the TC node herein, and the constant ½ Vcc voltage on the plate line results in a voltage, Vf, being developed across the ferroelectric capacitor at times when it is not being written to or read from, which voltage can cause the ferroelectric capacitor to switch, destroying the data held in the memory.

Another solution to the need to apply a voltage across the FeRAM to read it, is to pulse the common plate line only during certain portions of the read/write cycle. See for example, U.S. Pat. No. 4,873,664 issued Oct. 1989 to S. Sheffield Eaton and Tatsumi Sumi et al., "A 256 kb Nonvolatile Memory at 3V and 100 ns", in *ISSCC Digest of Technical Papers*, pp. 268–269, February 1994. In both these designs, the common plate line has a relatively large capacitance, and thus relatively large access time and a relatively slow memory. In addition, in the Eaton reference, the memory cell layout requires that adjacent rows of memory cells have unique plate lines, that is, if the plate lines are shared between rows, the deselected rows are sufficiently disturbed during the read or write cycles of adjacent rows, then the information in these shared but deselected rows is destroyed. The unique plate line for each row increases the area required by each row of memory cells. In the Sumi reference, the plate line is shared between two adjacent rows, however, only one of the rows is selected. One electrode of each ferroelectric capacitor in the deselected row receives the plate pulse. Because of a parasitic capacitance of the internal TC node in the cell structure, the internal TC node acts as a small capacitor in series with the large. ferroelectric capacitor. Since the higher voltage drop is across the smaller capacitor in a series of capacitors, a significant voltage is developed on the TC node, which results in a small voltage existing for a relatively long time across each ferroelectric capacitor in the deselected cells, causing a disturb of its data state.

A solution to the above problerhs is to refresh the TC node to the ½ Vcc voltage of the plate line often enough that the voltage on the node never falls below a threshold voltage during periods that it is not being read or written to, which threshold voltage is close enough to the plate voltage to prevent disturbance of the memory state. See Hiroki Koike et al. "A 60-ns 1-Mb Nonvolatile Ferroelectric Memory with Non-Driven Cell Plate Line Write/Read Scheme", in *ISSCC Digest of Technical Papers*, pp. 368–369, February 1996. This results in a faster access time, but complicates the peripheral circuitry, consuming chip area and reducing the density of the memory. In addition, periods of time during normal memory operation must be set aside for the refresh to take place, thereby restricting memory access and introducing wait states.

Another solution is to connect the TC node to ground and to the bit line when a cell is not selected. See Patent Abstracts of Japan, vol. 096, no. 11, Nov. 29, 1996, and JP 08180671 A (Matsushita Electric Ind. Co. Ltd.), Jul. 12, 1996. However, connecting three relatively unrelated portions of the memory, i.e., the isolated node, the ground, and the bit line, requires a relatively complex layout that significantly decreases the density of the memory. Thus, there remains the problem of how to design and fabricate an FeRAM that is as fast, failure resistant and dense as a conventional DRAM.

3. Solution to the Problem

The present invention provides a memory cell design that utilizes a shunt that significantly reduces the voltage across the memory element at times when the memory element is not being written to or read. By "shunt" is meant a simple switch or other direct electrical connection, such as a transistor or a diode. A "shunt" or a "shunt system" herein does not include a power source, such as a system supply voltage.

A ferroelectric memory element always includes a plurality of memory elements, and the shunt generally connects two different memory elements.

In a memory cell design that utilizes a plate line that is common to a plurality of different capacitors, a second shunt is connected between the TC node and the. common plate line.

In the preferred embodiment, adjacent TC nodes in the same row are shunted together, and there is only one shunt to the plate line every eight to thirty-two memory cells. This saves chip area.

In a memory cell design that utilizes a ferroelectric capacitor as the memory element, the shunt may connect the electrodes of the capacitor.

The shunt may be passive or active. Examples of a passive shunt include a Schottky diode, back-to-back diodes, and a resistor having a resistance sufficiently high to permit the desired coercive voltage to be applied during the read and write cycles and sufficiently low that current flows to the TC node from the plate line at least as fast as it leaks off the TC node due to leakage. An example of an active shunt is a transistor.

If the shunt is a transistor, and the plate line is raised to the full supply voltage, the shunt line connected to the shunt transistor gate is boosted. This ensures that the full supply voltage will pass through the shunt.

The shunt system is formed in the same process steps as the cell transistor and the cell capacitor. Thus, no additional-process steps are required to fabricate the shunt system.

The shunt system, for the most part, is located in areas of the chip that are redundant or contain other conventional cell parts, such as the bit line, at other levels in the layer structure. Thus, in general, the shunt system utilizes little additional chip area.

The invention provides a ferroelectric memory comprising: a switch; a ferroelectric memory element having a first electrode, the first electrode connected to the switch to create a node that is isolated when the switch is off; and a shunt system for directly electrically connecting the isolated node to another electrical element of the memory to essentially equalize the voltages on the first and second electrodes during a predetermined time. Preferably, the memory includes two of the isolated nodes, and the shunt system comprises a shunt device for directly electrically connecting the two isolated nodes. Preferably, the memory also includes a common plate line and the shunt system includes a second shunt device for connecting the isolated nodes to the plate line.

The invention also provides a method of operating a ferroelectric memory including a memory cell comprising a switch and a ferroelectric memory element having a first electrode, the first electrode connected to the switch to create a node that is isolated when the switch is off, the method comprising the step of: directly electrically connecting the isolated node to another electrical element of the memory to essentially equalize the voltages on the first and second electrodes during a predetermined time. Preferably, the memory cell includes two of the isolated nodes, and the step of directly electrically connecting includes the step of directly electrically connecting the isolated nodes. Alternatively, the step of directly electrically connecting comprises connecting the isolated node to the second electrode during the predetermined time.

In the preferred embodiment the invention provides a ferroelectric memory having: a plurality of memory cells, each comprising a transistor having a source/drain; a capacitor having a first electrode and a second electrode, the first electrode connected to the source/drain of the transistor to create a node that is isolated when the transistor is off; and a shunt system for directly electrically connecting the isolated nodes of a at least two of said cells at a predetermined time to essentially equalize the voltages on the- nodes during the predetermined time. Preferably, the shunt system comprises a shunt device selected from the group consisting of: a Schottky diode, a resistor, a pair of back-to-back diodes, and a shunt transistor. Preferably, the memory includes a supply voltage power source having an output voltage, the shunt transistor includes a gate, and the shunt system includes: a shunt line connected to the gate of the shunt transistor; and a signal generator for applying a shunt line signal to the shunt line, which signal is boosted above the voltage of the output voltage for at least a portion of the predetermined time.

Preferably, the memory includes a plurality of memory cells, each of the memory cells including one of the isolated nodes, and the shunt system comprises: a first shunt device for directly electrically connecting the one of the isolated nodes in each of the cells to one of the isolated nodes in another of one of the cells during the predetermined time; and a second shunt device for directly electrically connecting at least one of the isolated nodes to the second electrode of the capacitor during the predetermined time. Preferably, there is one of the second shunt devices for every $2^n$ of the memory cells, where n is an integer from zero to 10. Alternatively, there is one of the second shunt devices for every eight to thirty-two of the memory cells. Preferably, the memory further comprises a plate line for providing a voltage signal to the second electrode of the capacitor, and the shunt system comprises a shunt device for directly electrically connecting the isolated node and plate line. Preferably, the memory includes a memory cell having two of the transistors, two of the capacitors, and two of the isolated nodes, and the shunt system comprises a shunt device for directly electrically connecting the two isolated nodes. Preferably, the transistor and capacitor are part of a first memory cell in the memory, the memory includes a plurality of the memory cells and a plurality of word lines connected to the gates of the transistors in the memory cells, and the predetermined time includes essentially all of the cycles of the memory in which the word line connected to the first memory cell is not selected.

In a further aspect, the invention provides a ferroelectric memory cell comprising: a first transistor having a first source/drain and a second transistor having a second source/drain; a first capacitor having a first pair of electrodes and second capacitor having a second pair of electrodes, one of the first pair of electrodes connected to the first source/drain of the first transistor to create a first node that is isolated when the first transistor is off, one of the second pair of electrodes connected to the second source/drain of the second transistor to create a second node that is isolated when the second transistor is off; and a shunt device for directly electrically connecting the first isolated node and the second isolated node to essentially equalize the voltages on the nodes.

In still another aspect, the invention provides a method of operating a ferroelectric memory including a memory cell comprising a transistor having a first source/drain and a capacitor having a first electrode and a second electrode, with the first electrode connected to the source/drain of the transistor to create a node that is isolated when the transistor is off, the memory cell including two of the transistors, two of the capacitors, and two of the isolated nodes, the method comprising the step of: directly electrically connecting the isolated nodes at a predetermined time to essentially equalize the voltages on the first and second electrodes of the capacitor at the predetermined time. Preferably, the memory includes a bit line, a word line, and a plate line, the transistor includes a second source/drain and a gate, the bit line is connected to the second source drain, the word line is connected to the gate, and the plate line is connected to the second electrode, and the method further comprises: performing a write/rewrite cycle on the memory cell, including the step of raising the voltage on the word line; and, at the end of the write/rewrite cycle, adjusting the voltage on the bit line to the same voltage as the voltage on the plate line. Preferably, the memory includes a supply voltage power source having an output voltage, a shunt transistor including a gate, and a shunt line connected to the gate of the shunt transistor, and further comprising the steps of applying a voltage to the shunt line that is higher than the output voltage.

In yet another aspect, the invention provides a method of operating a ferroelectric memory cell comprising a first transistor having a first source/drain and a second transistor having a second source/drain, a first capacitor having a first pair of electrodes and second capacitor having a second pair of electrodes, one of the first pair of electrodes connected to the first source/drain of the first transistor to create a first node that is isolated when the first transistor is off, and one of the second pair of electrodes connected to the second source/drain of the second transistor to create a second node that is isolated when the second transistor is off, the method comprising the step of directly electrically connecting the first isolated node and the second isolated node to essentially equalize the voltages on the nodes.

The invention also provides a method of manufacturing a ferroelectric memory comprising a transistor having a gate and source/drain, a word line connected to the gate, a capacitor having a first electrode and a second electrode with the first electrode connected to the source/drain of the transistor to create a node that is isolated when the transistor is off, and a shunt for directly electrically connecting the second electrode and the isolated node, the method comprising the steps of: fabricating a word line by forming a conductive layer and patterning the conductive layer; and at the same time and in the same process steps as the step of fabricating the word line, fabricating the shunt line. Preferably, the method further includes the steps of: fabricating a connector between the first electrode and the source/drain; and at the same time and in the same process steps as the step of fabricating a connector, fabricating a connector between the node and the second electrode.

The shunt circuit according to the invention may be used advantageously in combination with each of the prior art circuits discussed above as well as with any other memory cell circuit that includes an isolated node. In combination with the circuits utilizing a refresh scheme, such as that discussed in the Koike et al. reference, it results in simpler peripheral circuitry, a smaller total chip area, and a shorter overall cycle times. In combination with circuits utilizing a driven plate line, such as discussed in the Sumi et al. reference and U.S. Pat. No. 4,873,664, it results in faster access times and prevents disturb of the memory cell. In combination with fixed plate voltage schemes, such as that of U.S. Pat. No. 5,038,323 referenced above, it prevents the disturb caused by the leakage from the TC node. Further, the solution is relatively simple and economical to manufacture. Numerous other features, objects and advantages of the invention will become apparent from the following description when read in conjunction with the accompanying drawings.

BRIEF DESCRIPTION OF THE DRAWINGS

FIG. 1 is an electrical circuit diagram of a generalized memory cell according to the invention;

FIG. 2 is an electrical circuit diagram of one preferred embodiment of a memory cell according to the invention;

FIG. 3 is an electrical circuit diagram of another preferred embodiment of a memory cell array according to the invention;

DESCRIPTION OF THE PREFERRED EMBODIMENT

1. Overview

Figure 4:
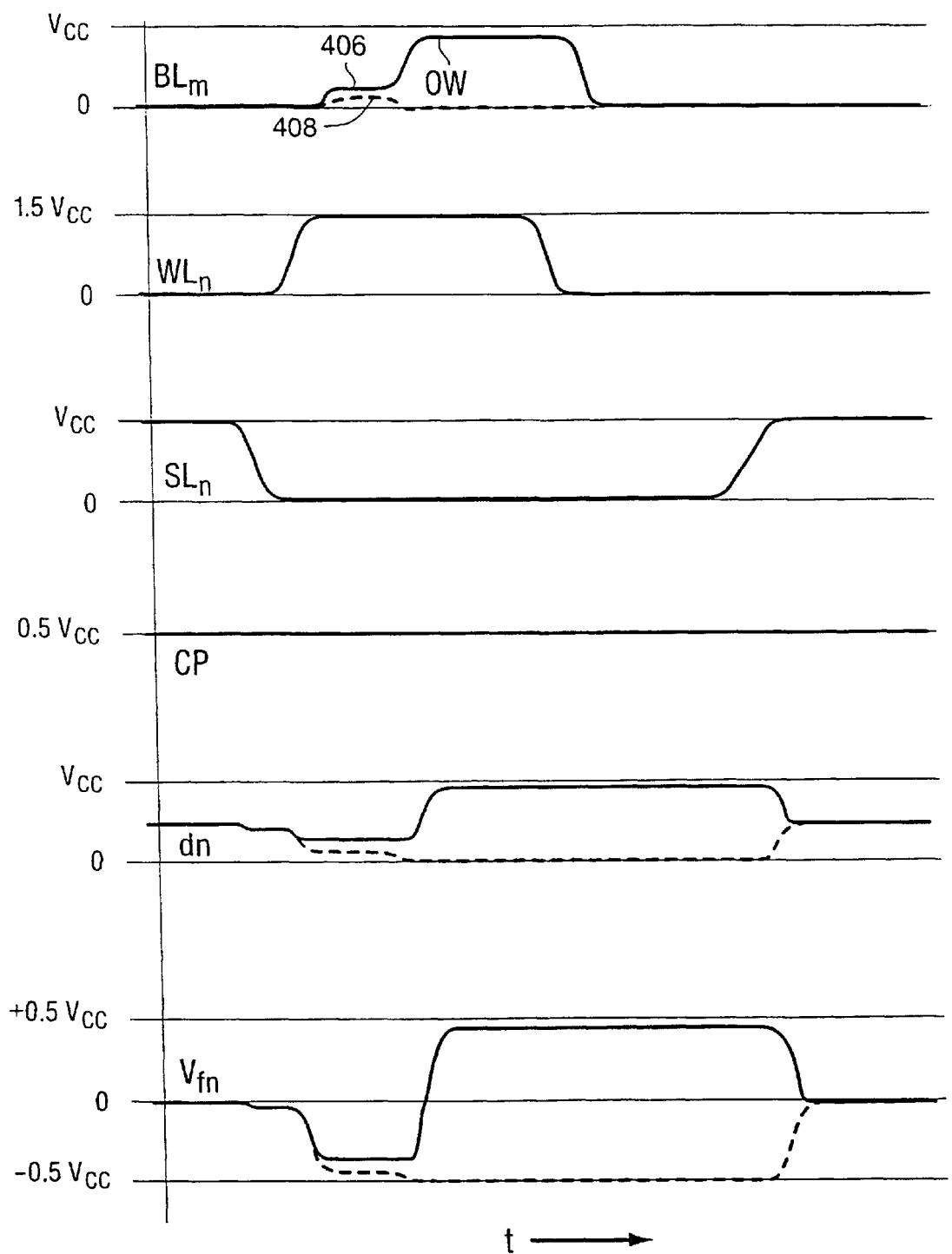
FIG. 4 is a timing diagram showing the voltages developed on the electrical lines and across certain elements of the circuit of FIG. 3 as a function of time.

Directing attention to FIG. 1, an generalized electrical circuit diagram of a memory cell 20 according to the invention is shown. Memory cell 20 comprises ferroelectric memory 22, switch 24 and shunt 26. As known in the art, memory cell 20 is preferably one of many cells in an array of memory cells. Ferroelectric memory element includes a first terminal 27 and a second terminal 29. Memory cell 20 is programmed by placing a voltage across memory element 22 with lines 30 and 32. To prevent ferroelectric memory element 22 from being disturbed when other cells connected to line 30 are addressed, switch 24 is inserted between line 30 and ferroelectric memory element 22, creating a node 34 that is isolated when switch 24 is open. Switch 24 is preferably controlled by signals on line 28. In any practical memory, node 34 can pick up a charge through various leakage paths, which charge can disturb ferroelectric memory element 22. According to the invention, a shunt 26 is connected between node 34 and another element of the memory, such as terminal 29 or line 32, to essentially equalize the voltages on terminals 27 and 29 at a predetermined time or times in the memory cycle to prevent charge or voltage on node 34 from disturbing ferroelectric memory element 22. Ferroelectric memory element may be a capacitor, a FET, or any other suitable ferroelectric element. Shunt 26 may be passive or active. Examples of a passive shunt include a Schottky diode, back-to-back diodes, and a resistor having a resistance sufficiently high to permit the desired coercive voltage to be applied during the read and write cycles and sufficiently low that current flows to the TC node from the plate line at least as fast as it leaks off the TC node due to leakage. An example of an active shunt is a transistor. Switch 24 may be a diode, a transistor, or any other electronic switch. Line 30 may be a bit line and line 32 may be a plate line, though architectures in which these lines are other memory lines are contemplated.

FIG. 2 shows one preferred embodiment of the invention. In FIG. 2, as well as subsequent figures herein, elements that are identical to elements already introduced in preceding figure(s) are identified by the same numeral as used in the preceding figure(s). In this embodiment, ferroelectric memory element 22 is a capacitor and terminals 27 and 29 are the electrodes of the capacitor. Switch 24 is a transistor having a gate 21, a first source/drain 25 and a second source/drain 24. The gate 21 of transistor 24 is connected to a word line 28, one source/drain 23 is connected to a bit line 30, and the other source/drain 25 is connected to one electrode 27 of capacitor 22. The other electrode 29 of capacitor 22, commonly called the plate electrode 29, is connected to a plate line 32. Shunt 26 is shown as a back-to-back diode pair 42 and 44. Shunt 26 is connected between TC node 34 and plate line 32. Preferably, transistor 21 is a MOSFET. Ferroelectric capacitor 22 may be made of a layered superlattice compound, such as strontium bismuth tantalate, PZT, or any other ferroelectric material that is useful in an integrated circuit, between a pair of electrodes 27 and 29. As is known in the art, memory cell 40 is usually one of many cells in an array composed or rows and columns of such cells, and the complete integrated circuit memory includes a plurality of word lines, such as 28, and a plurality of bit lines, such as 30. In the art, such a memory, without the shunt 26, is referred to as a "1T/1C" memory, since it utilizes one transistor and one capacitor in a memory cell 20. The plate line 32 may be common to all memory cells, be common to several rows or columns of memory cells, may be separate for each row of memory cells, may be separate for each column of memory cells, or may have other configurations. Also as known in the art, the circuit 40 may be a complete memory cell, or, in the case of a memory having a 2T2C (two transistors, two capacitors) cell, half of a memory cell, in which case a similar paired cell in a complementary state acts as a reference for cell 40. For a detailed discussion of particular layered superlattice compounds and their use in a typical integrated circuit memory, see U.S. Pat. No. 5,519,234.

Node 34 is the node referred to as the TC node above. As discussed above, and as known in the art, there are a variety of leakage paths to and from node 34 which cause charge to leak from the node, which leakage we will refer to herein as the parasitic leakage of node 34. There is a parasitic resistance associated with this leakage, which we will refer to herein as the parasitic leakage resistance of node 34. As will be seen in detail below, shunt 26 equalizes the voltage between node 34 and plate 32 at certain portions of the memory cycle, or at least keeps the voltage difference between node 34 and plate line 32 sufficiently low that the voltage, Vf, across ferroelectric capacitor 22 is less than a minimum voltage that would disturb the state of memory cell 40.

Shunt 26 may be any device that provides a direct electrical connection between the node 34 and terminal 29 to essentially equalize the voltages on the node 34 and the terminal 29 within a time that will prevent a disturb to the electronic state of the ferroelectric memory element 22. A direct electrical connection is one in which it is intended that current flow through the connection. Thus a connection between the source and drain of a transistor that is turned on is a direct electrical connection, but a connection through a capacitor is not a direct electrical connection. "Essentially equalize" means that the voltages on node 34 and terminal 29 are equal within a voltage difference that is so small that it cannot create a disturb. In a practical electronic device, two voltages can rarely be exactly equal. For example, a turned on transistor will have a small voltage difference between its source and drain, since the transistor channel has some resistance. In fact any conductor that is not a superconductor will develop a small voltage difference across it when a current is passed through it or a voltage is applied to it. Essentially voltages less than 100 millivolts (mv) will not create a disturb to state-of-the-art ferroelectric capacitors, thus any voltages that are different by an amount less than or equal to this value can be considered herein to be "essentially equal". Preferably, the shunt keeps the voltage difference across the capacitor to 10 mv or less; that is the voltages on the node 34 and the terminal 29 are equal to within 10mv. As known in the art, the time it takes for a ferroelectric material to respond to a switching voltage depends on the temperature of the material, the thickness of the capacitor, and the applied electrical field (voltage). For a film thickness of about 1850 Å and an applied voltage of 5 volts at room temperature it takes about one or two nanoseconds (ns) for a state-of-the-art ferroelectric material to switch. For a 2400 Å thick sample, and applied voltage of 3 volts, and a temperature of –25° C., it takes about 100 ns for the same material to switch. A typical state-of-the-art memory using an applied voltage of about 3 volts and a 2400 Å thick ferroelectric thin film switches in about 10 ns to 20 ns at room temperature. Thus, for current state-of-the-art ferroelectric devices, for disturbs of about 3 volts, the voltages should be equalized in 10 ns or less and preferably in about 1 nanosecond or less.

Typical electronic devices that may be used as a shunt include a transistor, a diode and, in particular, a Schottky diode, back-to-back diodes, and a resistor having a resistance sufficiently high to permit the desired coercive voltage to be applied during the read and write cycles and sufficiently low that current flows to the TC node from the plate line at least as fast as it leaks off the TC node due to leakage.

2. Detailed Description

In the embodiment of the invention shown in FIG. 2, shunt 26 is a pair of back-to-back diodes 42 and 44. The cathodes of the diodes 42 and 44 are connected, the anode of diode 42 is connected to the source/drain 25, and the anode of diode 44 is connected to plate line 32. As known in the electronics art, each of diodes 42 and 44 function to permit current flow only in the direction from anode to cathode, and thus the back-to-back pair operate to prevent current flow from node 34 to plate line 32. However, the diodes are selected to be leaky when reverse-biased, so that in practice they permit sufficient current to flow between plate line 32 and node 34 so that the voltage, Vf, across capacitor 22, when it is not being read or written to, is well below the coercive voltage, Vc, of the capacitor, that is the voltage that will cause it to switch. The leakage is small enough, however, that the voltage applied across capacitor 22 in the read and write cycles remains well above the coercive voltage during the short time which it takes the capacitor to switch in the read and write cycles. Preferably the leakage of the diode pair 42, 44 is one hundred or more times greater than the sum total of the parasitic leakages of the TC node 34. For a typical state-of-the-art ferroelectric memory, the leakage of the TC node is on the order of about 1 microamp per square centimeter (cm). Preferably, the leakage of the diode pair 42, 44 is between 1 microamps per square cm and 1000 microamps per square cm, and most preferably from about 50 microamps per square cm to 150 microamps per square cm. In the preferred embodiment, the leakage of the diodes is about 100 microamps per square cm.

Preferably the diodes 42 and 44 are Schottky barrier diodes. They are preferably formed by using the capacitor electrodes 27 and 29, which are preferably formed of platinum, as the anodes of the diodes, and connecting the electrodes with a layer of lightly-doped n-type polysilicon, which acts as the cathode of each of the diodes.

FIG. 3 shows an electrical circuit diagram of another preferred embodiment of the invention comprising a memory array 50 including a memory cell 52. Memory cell 50 is identical to the memory cells 20 and 40 discussed above except that the shunt device 26 comprises a transistor 56 having a pair of source/drains 57 and 58. Preferably transistor 56 is a MOSFET. Source/drain 57 is connected to node 34 and source/drain 58 is connected to plate line 32. The gate of transistor 56 is connected to shunt line 60. A second memory cell 62 that is identical to memory cell 52, except that the gate 61 of its transistor 24 is connected to a different word line 68 and the gate 69 of the shunt transistor 66 is connected to a different shunt line 70, and its other connections are mirror images of those of memory cell 52 reflected across common plate line 32. As is known in the art, the column of memory cells including memory cells 52 and 62, which connect to bit line 30, is replicated many times, each column having a separate bit line as indicated by the dotted lines 74 and 76, and the rows of memory cells, such as the row including memory cell 52 is replicated many times, each row having separate word and shunt lines, as indicated by dotted line 78, with each pair of rows sharing a common plate line, to form memory array 50. As known in the art, to operate the memory 50, signals WLn and CP are applied to nth word line 28 and common plate line 32, respectively, by circuitry (not shown) on the IC chip, and a signal BLm is applied to or developed on mth bit line 30 during the write and read cycles, respectively. Similar signals, such as WLn+1, are applied to or developed on other word, bit, and plate lines of the memory array 50. According to the embodiment of the invention shown in FIG. 3, to operate the integrated circuit memory 50 according to the invention, an additional signal SLn is applied to the nth shunt line 60 by circuitry (not shown) on the IC chip. Similar signals are applied to the other shunt lines, such as 70, corresponding to the other rows 78 of the memory array 50. The circuitry for generating the signals just discussed will not be discussed in detail herein, since such circuitry is well-known in the art. In addition, a signal dn is developed on TC node 34, as well as the other TC nodes, during the course of operating the invention. The signal Vfn developed across the nth capacitor 22, has already been mentioned.

The operation of the embodiment of the invention shown in FIG. 3 may be understood by considering the signals applied to and developed on the various elements of the circuit 50 during a typical read/write cycle. A timing chart showing the signals BLm, WLn, SLn, CP, dn, and Vfn, in volts, as applied to and developed on the various circuit elements in FIG. 3 as a function of time is shown in FIG. 4. In this embodiment, the plate line 32 is common to all memory cells in the array 50 and is held at a constant voltage of ½ Vcc. Prior to the beginning of the cycle, SLn is high, causing shunt resistor 56 to turn on, and connect node 34 to the plate line 32. Thus, the signal dn on node 34 is at a voltage that is very slightly less than ½ Vcc, the very small deviation from Vcc being due to a small voltage drop across transistor 56 due to the voltage division caused by the voltage divider consisting of its internal resistance in series with the parasitic leakage resistance of node 34. At the beginning of the cycle, SLn falls to zero volts, turning off transistor 56, and WLn goes high, turning on transistor 24 and connecting node 34 to bit line, 30, which, as known in the art, has been "precharged" to zero volts and then allowed to float. As known in the art, the word line is boosted, that is WLn goes to 1.5 Vcc. The voltage Vfn begins to go negative, due to the node 34 dropping toward the bit line voltage while the plate line stays at ½ Vcc, until the voltage Vfn is larger than the coercive voltage of the capacitor 22. That is, the circuit develops the voltage "read voltage", i.e., the voltage discussed in the background of the invention that is necessary to read the memory cell. At this point, if the capacitor 22 is in a state having a polarization direction opposite to the direction of the electric field developed by the voltage difference, i.e. the opposite state condition to the read voltage, it switches. If it is in the state having the same direction as the field, i.e., the same state condition as the read voltage, it does not switch. The signals BLm, dn, and Vfn after this point take on one of two different values, depending on the state of the ferroelectric capacitor 22 prior to the beginning of the cycle. The values when the prior state is the opposite to the direction of the read voltage are given by the solid lines, while the values when the prior state is the same as the read voltage state are given by the dotted lines. In the same state condition, dn and BLm go to nearly zero—they do not go completely to zero due to the fact that there is always some charge transfer to the bit line as a result of the linear capacitance of the ferroelectric capacitor 22—and thus Vfn goes to nearly –½ Vcc. In the opposite state condition, the switching ferroelectric capacitor provides a switching charge which raises the bit line voltage BLm a bit more and thus prevents the voltage dn of node 34 from falling as far, and decreases the negative voltage Vfn developed across capacitor 22. As known in the art, a sense amplifier (not shown) connected between bit line 30 and a reference voltage, forces the bit line to Vcc if it detects the higher opposite state voltage 406. This drives dn to Vcc and Vfn to essentially +½ Vcc. If the senses amplifier senses the same state voltage 408 on bit line 30, it forces the bit line, and thus dn, to essentially zero volts, and drives Vfn to essentially –½ Vcc. In either case, this rewrites the memory to the same state it originally was in, and at the same time outputs the original state of the cell to an external storage location via bit line 30. Optionally, a write can be done to the memory cell once it has been read, essentially at the point indicated by "OW" on the BLm curve of FIG. 4. In this case, the bit line would be driven either high or low depending on the data to be written to the cell, with the corresponding effects on dn and Vfn. The optional write cycle makes the complete memory cycle more compact. After the state of the cell has been read and, optionally, written to, the word line signal WLn drops to zero turning off transistor 24. The BLm signal then is driven to zero again, as known in the art. Before the voltage can be bled off node 34 via the various leakage modes discussed in the Background of the Invention, the shunt line signal SLn goes high, turning on transistor 56 and causing dn to go to essentially ½ Vcc, and Vfn to fall to essentially zero. This prevents any disturbance of the state of the memory cell 52 until the next read/write cycle.

Figure 5:
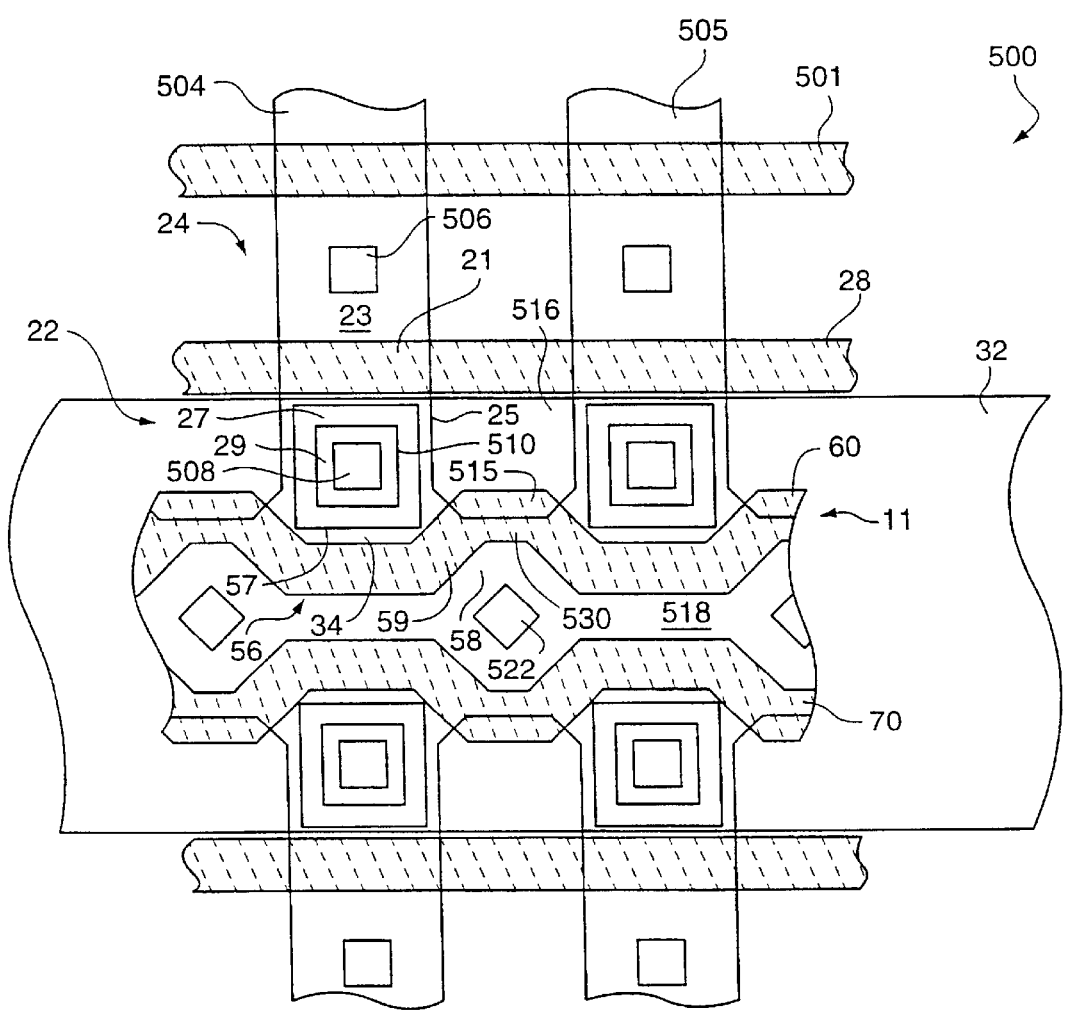
FIG. 5 is an exemplary layout of the memory cell of the circuit of FIG. 3.

An exemplary layout 500 of the integrated circuit memory array 50 (FIG. 3) according to the invention is shown in FIG. 5. As known in the art, the layout 500 represents masks that are used in manufacturing the array 50, and also can be considered to show the various portions of the circuit as deposited on a lightly doped silicon substrate. The layout 500 shows two columns of the array, a single row, and part of another row; the rest of the array is simply repetitions of the parts shown. Bit lines are not shown so that the other portions will be clearer. The horizontal shaded areas 28, 70, etc. are polysilicon lines that are the word and shunt lines respectively. The vertical structures 504 and 505 as well as the portions such as 518 connecting the vertical structures are the heavily doped active areas. Where lines 28, 70, etc. cross an active area, such as at 21 and 59, a gate of a transistor is formed. As known in the art, the ion implants that create the active areas are performed after the polysilicon is laid down and patterned, and the polysilicon prevents the ion implants from reaching the areas of the active areas 504 and 505 which the polysilicon covers. Various parts of the circuit, such as capacitor 22, with electrodes 27 and 29, and ferroelectric layer 510, and transistor 24 with active areas 23 and 25 and gate 21, and shunt transistor 56 with active areas 57 and 58 and gate 59, and plate line 32 are indicated by the same numbers used in FIG. 3. The active area 25 of transistor 24 and the active area 57 of transistor 56 are essentially the same area that lies under the bottom electrode 27 of capacitor 22, and comprises the TC node 34. The bit line contact 506 to active area 23 is a hole formed in the other layers, which are filled with a conductor, such as aluminum, tungsten, titanium, polysilicon, a combination thereof, or other appropriate material as known in the art. The plate line contact area 522 to active area 58 is also a hole through the other layers that filed with a similar conductor, preferably comprising titanium, that contacts plate line 32. Top electrode 29 is formed by a portion of the plate line 32 that contacts ferroelectric layer 510 and fills an etched area above the ferroelectric layer 510. Plate line 32 is preferably formed of platinum, but may also comprise other conductive materials as known in the art. Area 516 is a thick field oxide area, as known in the art. Shunt line 70 overlaps field oxide area 516 at 515, so that if the masks are slightly misaligned, an undesirable conducting area is not formed by the active area implant. This design can create a small undesirable channel area 530 that is conducting while shunt line 70 is on and connects the TC node 34 with the TC node of the next cell. This creates no problem if both cells are non-selected, since both will always be at the same voltage at this time. However, if one cell is selected and the other is not, the node of the non-selected cell will be at ½ Vcc and the node of the selected cell will vary between zero and ½ Vcc. This could create a disturb on the unselected cell. The area 530 is actually smaller than indicated in the drawing, since it would not be able to be shown clearly in a "to scale" drawing, and and if the contact 522 to the plate line 32 is a low resistance contact, the leakage through the channel area 530 will not create a disturb and will not affect the circuit.

The area occupied by the shunt system 11 in the layout of FIG. 5 is an area that normally separates every second row of the array to isolate the rows. The shunt system holds the areas 25, 59, 518, and 530 at a predefined voltage, ½ Vcc in the above embodiments, as long as shunt line 60 is at Vcc. Thus, this area still serves to isolate one set of rows from the next, even with the shunt system in place. In practice, this area may be made a little larger to accommodate the shunt transistor, and, if necessary, to add additional field oxide 516 to close up channel 530, but, with careful control of mask alignment, the extra area is not necessary. Thus, the shunt system 11 in this design uses up very little, if any additional space on the chip. Further, preferably, the shunt line 60 and shunt transistor 56 are made at the same time and in the same process steps that the word line 28 and transistor 24 are made, and the holes 522, the plug that fills the holes and the rest of the connection to plate line 32 are made at the same time and in the same process steps as the hole 506 and the metallization connection to the active area 23 is made, in which case the fabrication of the shunt system 11 does not require any additional manufacturing process steps.

Figure 6:
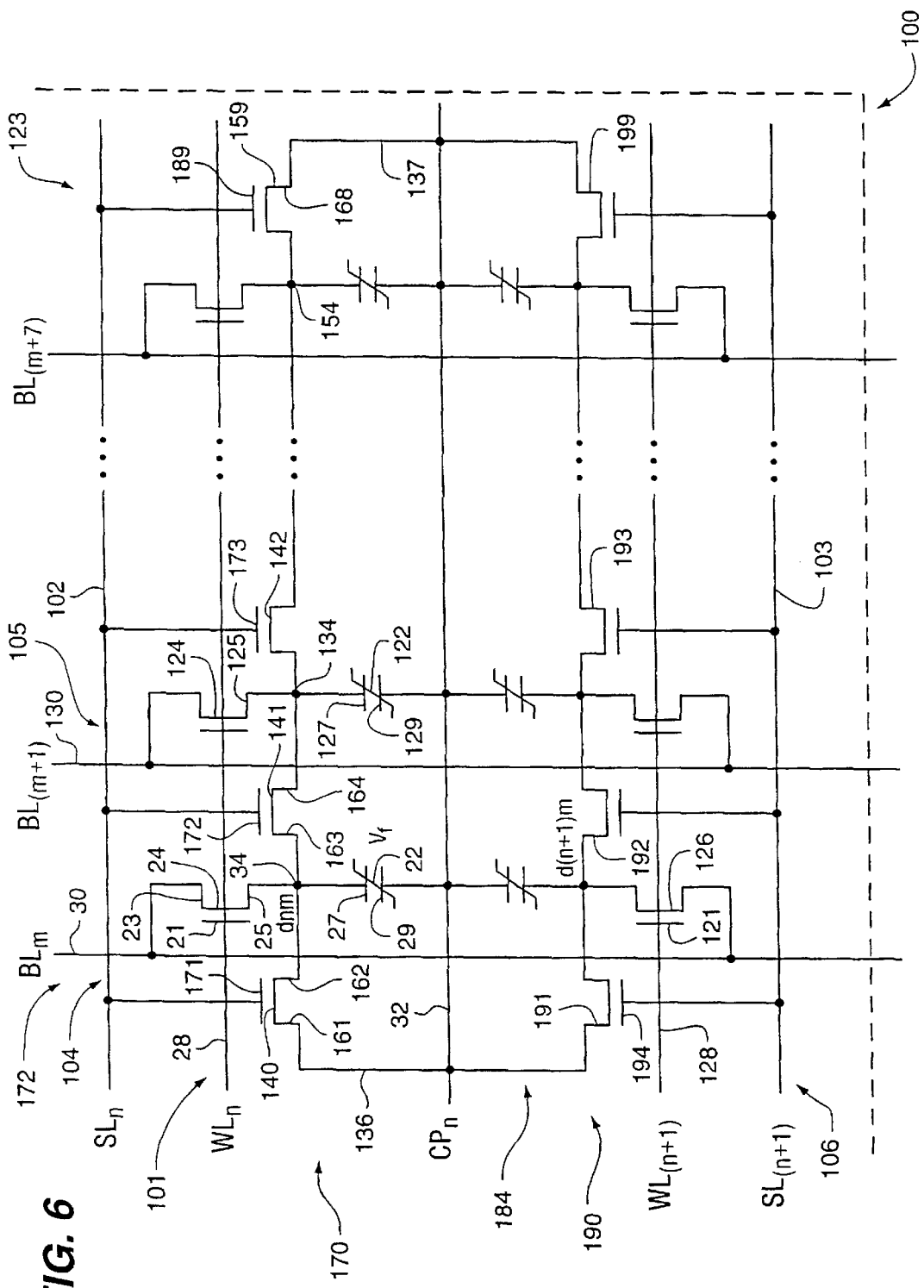
FIG. 6 is an electrical circuit diagram of a preferred embodiment of a memory cell array according to the invention in which a single shunt line serves many memory cells.

A memory array 100 according to the invention in which a single shunt connection 137 to plate line 32 serves many memory cells 104,105 is shown in FIG. 6. In this embodiment, as in the embodiments of FIGS. 2 and 3, the basic memory cell 104 comprises a ferroelectric capacitor 22 and a transistor 24 connected as described in the discussion of FIG. 1. Each memory cell 104 also includes a shunt transistor such as 140. The basic memory cell 104 is one of a plurality of cells 104, 105 through 123 forming a row 170 of memory cells, with the cells between 105 and 123 indicated by three dots, and is one of a plurality of cells 104, 184, etc. in a column 172 of cells. As known in the art, a plurality of such rows and columns of cells make a memory array 100. Source/drain 161 of shunt transistor 140 is connected to plate line 32, and also to the source/drain of the right-hand shunt transistor (not shown) of the previous memory cell (not shown), while source/drain 162 is connected to node 34. Source/drain 163 of shunt transistor 141 is connected to node 34, while source/drain 164 is connected to node 134. In similar fashion, the shunt transistors 142 through 159 in row 170 are connected in series between the nodes 134 through 154 of cells 105 through 123. The source/drain 168 of shunt transistor 159 is connected to plate line 32 and also to the left hand shunt transistor (not shown) in the next memory cell (not shown). In this manner, all the shunt transistors 140, 141 etc. in row 170 are connected in series between the isolated nodes 34, 134, etc. and every so often there is a line, such as 136 and 137 connected to the source/drain, such as 161 and 168 of one or two transistors, which line 136, 137 is connected to the plate line 32. In the preferred embodiment, every $2^n$ memory cells, that is every $(2^n+1)$ shunt transistors 141, 142 etc, where n is an integer from zero to ten, a source/drain is connected to the plate line, though the invention contemplates that this number preferably depends on many factors, including materials that are used for the shunt system 101, various tradeoffs between area used in the cell and the reliability of the memory, the application to which the memory is to be applied, and other design criteria. Most preferably n=3 and thus a source/drain is connected to the plate line every nine shunt transistors 141, 142 etc. The gates 171, 172, 173, through 189 etc. of all the shunt transistors 140, 141, 142, 159 etc. in row 170 are connected to shunt line 102. Thus, when shunt line 102 is high, all the shunt transistors 140, 141, 142, 159 etc. are turned on, and all the nodes 34, 134, through 158 etc. are connected to plate line 32, through at most $(2^n)/2$ transistors, depending on where the node is in the row 170. Similarly, the (n+1)th row 190 includes a series 181, 182, 183, through 199 etc. of shunt transistors the gates of which are all connected to shunt line 103, and so on for each row of memory cells in the array 100.

It is possible in the embodiment of FIG. 6, where the shunt between the internal TC node and the plate line is placed only every so often in a row, that an occasional memory storage situation will result in a disturb. Such a situation would be where a single signal of one type, say a low signal, was stored between a large number of signals of the other type, say high signals. Then, when the shunt line 102 turns on, there may be a temporary signal higher than ½ Vcc that would be placed on a node that was switched to the low state, which could disturb the cell and possibly switch the cell back to the high state. Similarly, if a cell with a high signal was neighbored by many cells with low signals. If a neighboring cell has the same signal, there is no disturb, since any temporary voltage across the cell would be in the same direction as the state stored in the cell. If only one neighboring cell has an opposite sign, this also would not create a disturb since the net signal would just be ½ Vcc.

The disturb described in the above paragraph can be overcome by bringing the bit line back to the plate line voltage after the rewrite phase of the cycle and before the word line drops. See, for example, the embodiment of FIG. 11 below. This ensures that there is no voltage across any of the ferroelectric capacitors, no matter whether they hold a high or a low state.

Figure 7:
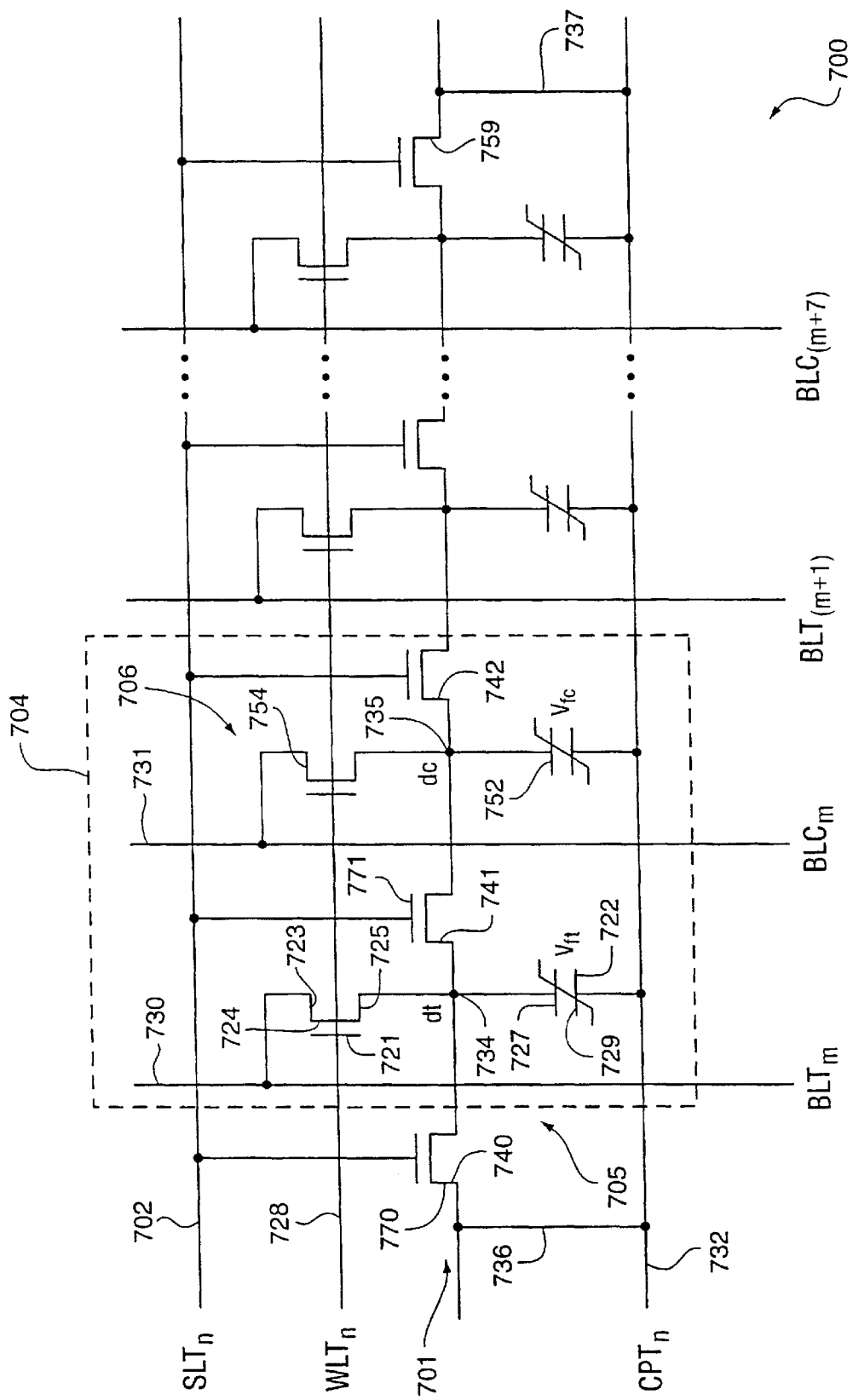
FIG. 7 is an electrical circuit diagram of a preferred embodiment of a 4T2C memory cell array according to the invention.

Another way of overcoming the above-mentioned disturb is the use of a related preferred embodiment of the invention, namely the memory array 700 that is shown in FIG. 7. The basic memory cell 704 of array 700 is a 4T2C design, that is, it includes four transistors, 724, 754, 741, and 742, and two capacitors 722 and 752. A comparison of the circuit of FIG. 7 with that of FIG. 6 will show that the connections between the transistors 724, 754, 741, and 742, the capacitors 722 and 752, the bit lines 730 and 731, the word line 728, the shunt line 702, and the plate line 732 of FIG. 7 is the same as the connections between the transistors 24, 124, 141, 142, the capacitors 22 and 122, the bit lines 30 and 130, the word line 28, the shunt line 102 and the plate line 32 of FIG. 6. The shunt system 701 elements and connections in FIG. 7 are also the same as in FIG. 6. In particular, there is a line 736, 737 connecting to the plate line 732 every so often, and an extra transistor 740 at the connection to ensure that each TC node, such as 734, has a transistor, such as 740, between it and the plate line 732. The difference in the circuit of FIG. 7 is in the signals BLTm, BLCm, SLTn, WLTn, and CPTn applied to the lines 730, 731, 702, 728, and 732, respectively. Without the shunt system 701, the circuit of FIG. 7 is a well-known 2T2C design used in both DRAMS and FeRAMs in which the ½ cell 705 comprising capacitor 722 and transistor 724 acts as a dummy or complementary cell for the ½ cell 706 comprising capacitor 752 and transistor 754. Thus, the cell 704 is an improvement of the aforementioned 2T2C memory cell design, the key part of which improvement comprises the shunt system 701. As in the known 2T2C design, in the improved 4T2C design, capacitor 752 is always in the opposite state to capacitor 722, and thus at the end of the read and write cycles one of nodes 734 and 735 will be at the high or Vcc voltage and the other will be at the low or zero voltage. Thus, when the shunt line 702 goes high and transistor 741 turns on, the voltage on the nodes 734 and 735 will quickly go to ½ Vcc. This is true for each 4T2C cell, therefore all the isolated notes will go to ½ Vcc. Thus, in such a design, very few connections 736, 737 etc. to plate line 732 are required, since, if the plate voltage is fixed and not pulsed, their only function will be to keep the isolated nodes 734 and 735 at ½ Vcc, rather than bringing them to ½ Vcc after a read or write.

Figure 8:
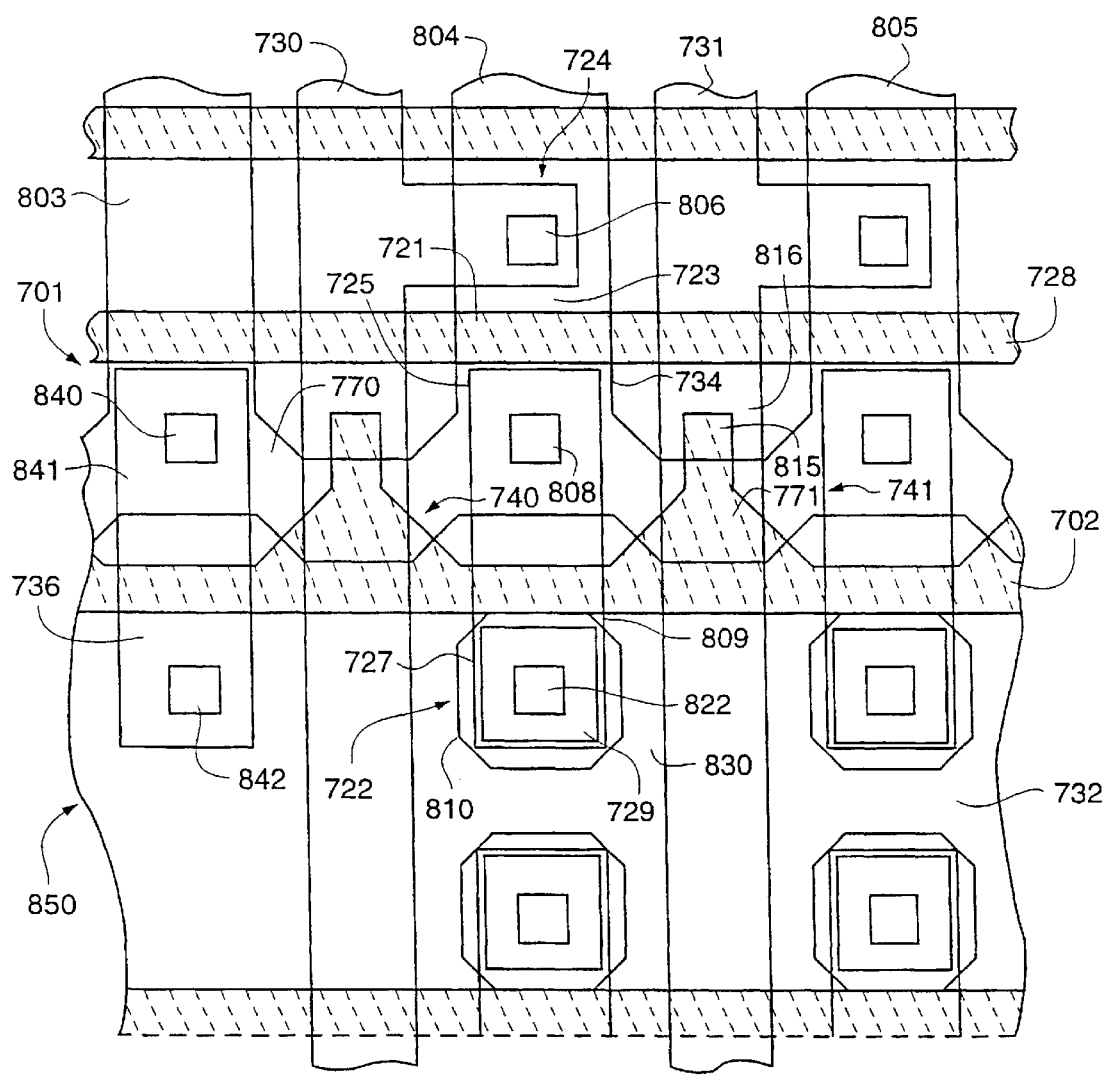
FIG. 8 is an exemplary layout of the of the circuits of FIGS. 6 and 7.

An exemplary cell layout of the memory arrays 100 and 700 is shown in FIG. 8. For ease of discussion, we shall discuss it in terms of the circuit 700 of FIG. 7, which is directly above it, though, as will be evident to those skilled in the art, it could also be discussed in terms of the circuit 100 of FIG. 6. As in FIG. 5, the polysilicon word line 728 and shunt line 702 are the primarily horizontal shaded areas, and the primarily vertically oriented areas 803, 804 and 805 are the heavily doped active areas. Again, the areas under the polysilicon are not doped or implanted, and where the polysilicon crosses an active area, gates, such as 721 and 771 of transistors, such as 724 and 741, respectively, are formed. The bit lines 730, 731 are shown in this layout. Bit line 730 contacts active area 723 via metallization conductive plug in contact 806. In this embodiment, the ferroelectric capacitor 722 is set off on a thick oxide layer 830 some distance from the transistor 724. See U.S. Pat. No. 5,468,684 issued Nov. 21, 1995 for a detailed discussion of such a capacitor structure. Contact with the active area 725 is made through a conductive plug in contact hole 808, and a metallization layer 809 that connects to bottom electrode 727. Ferroelectric layer 810 covers the bottom electrode 727 and top electrode 729 overlies ferroelectric layer 810. Contact between top electrode and plate line 732 is made via a contact hole 822 and a portion of the plate line metallization that penetrates the hole and contacts ferroelectric layer 510. Shunt line 702 overlaps field oxide area 816 at 815, so that if the masks are slightly misaligned, an undesirable conducting area is not formed by the active area implant. Contact between the shunt active area 770 of transistor 740 is made every 2, 4, 8, 16, or 32 cells by way of a contact hole 840 to shunt transistor active area 770, metallization 841 which forms connection 736, and contact hole 842 through which a conductive plug connects to plate line 732.

The designs of FIGS. 6 and 7 use substantially less chip area than comparable prior art memory designs that avoid a disturb to the memory cells. The extra MOSFETs, i.e. shunt transistors 140 etc. use very little chip area: they underlie the bit lines, 730 and 731; they use a polysilicon line that is already included in the cell design or may be easily incorporated; they utilize an already existing doped active area; and they do not require any extra contacts. The major use of cell area is by the connections 136, 137, 736, 737, etc. to the plate line, which do require extra area. However, since these occur only about every eight to thirty two cells, the extra cell area used by the connection to plate line is kept to a minimum and is far less than the area consumed by prior art solutions to the problem. Further, the fabrication of the shunt line 702 and shunt transistors, such as 741, takes place at the same time and in the same process steps as the fabrication of the word lines 728 and transistor 724 and the entire shunt connection 850, i.e. connector 736, the contact hole 840 and plug filing the hole, and the contact hole 842 and metallization filing the hole, is formed at the same time and in the same process steps that are used to make the connections between the capacitor 722 and the active area 725, therefore, no additional process steps are required to manufacture shunt system 701.

Figure 9:
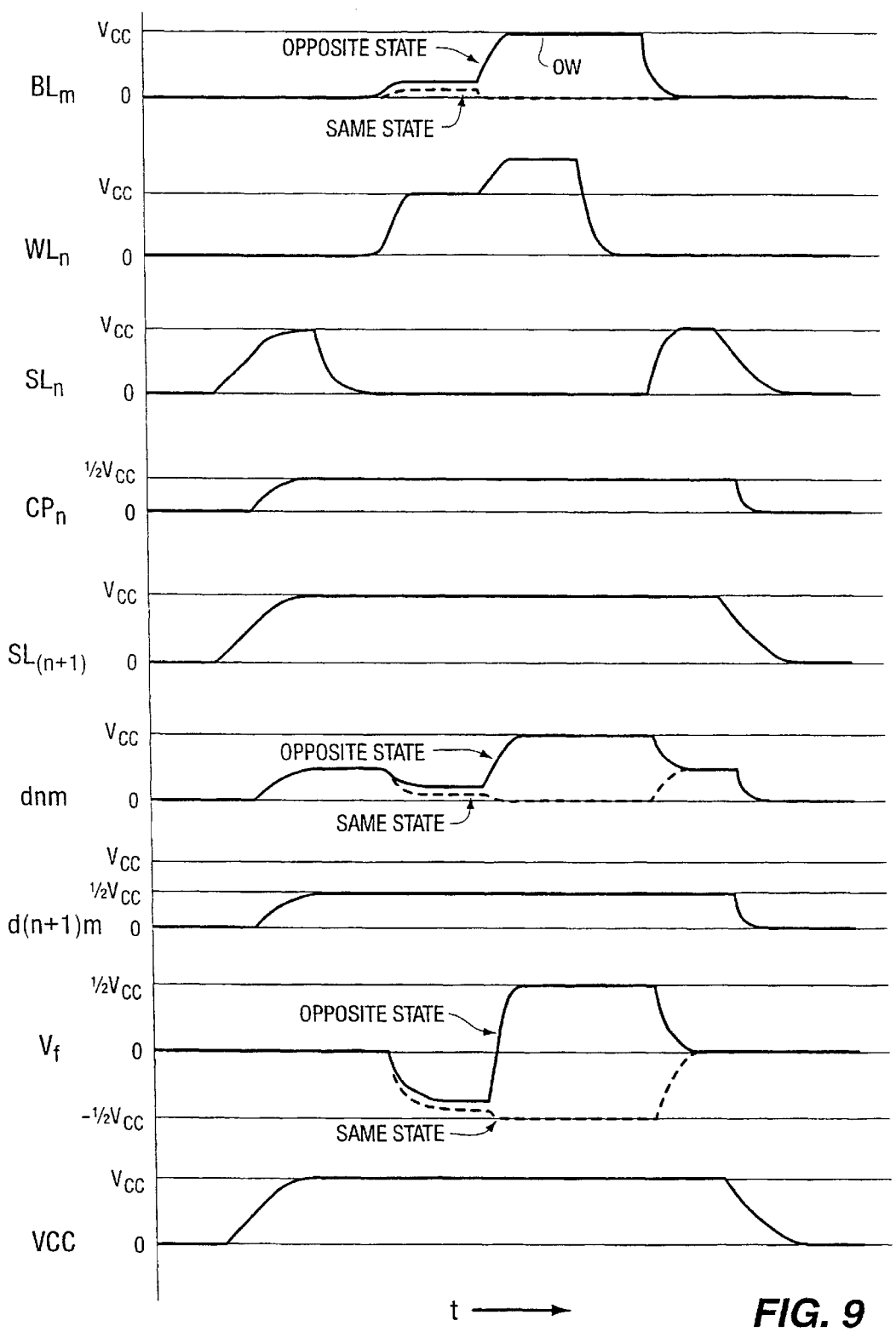
FIG. 9 is a timing diagram showing the voltages developed on the electrical lines and across certain elements of the circuit of FIG. 6 as a function of time when a fixed plate voltage is used.

FIG. 9 is a timing diagram, i.e. a graph of voltage along the ordinate versus time along the abscissa, showing the signals BLm, WLn, SLn, CPn, SL(n+1), dnm, d(n+1)m, Vf, and Vcc for an embodiment of FIG. 6 in which the plate voltage CPn is fixed. In discussing this timing diagram, we shall refer to cells 104 and 184, since the other cells operate similarly when their word and bit lines are selected. The timing diagram of FIG. 9 assumes that the 2T1C memory cell 104 is being read or written to, that it is the selected cell, and that cell 184 is deselected. Vcc normally stays on between cycles, as long as the memory power is on, but is shown as coming on at the start of the cycle and going off at the end the cycle to enable the power up and power down timing to be discussed along with the cycle timing. The shunt line signals, SLn and SL(n+1), as well as the rest of the shunt lines in the array 100, come on to Vcc at power up along with the supply voltage, Vcc. This turns on the shunt transistors 140, 141 etc. and 191, 192 etc. Shortly thereafter, the plate line voltage, CPn, comes up to ½ Vcc, and dnm and d(n+1)m rise to ½ Vcc, since the shunt transistors 24 and 191 are on, and therefore Vf stays at zero. Just prior to the start of a read/write cycle of cell 104, SLn goes low turning off transistors 140 and 141 etc., and shortly thereafter WLn goes high, turning on transistor 24. BLm is low, due to a precharge known in the art, and thus dnm drops toward a near zero voltage. The signals BLm, dnm, and Vf then respond as discussed for the corresponding signals of FIG. 4, with the optional write again taking place at the point OW, with one difference. In this case the word line signal WLn at first rises to Vcc and then is boosted to 1.5 Vcc by a boost circuit (not shown) which permits BLm and dnm to rise to the full Vcc voltage or fall to the full zero voltage, depending on the state of the memory cell 108, and thus results Vf rising to a full ½ Vcc voltage or falling to a full zero voltage. The WLn signal drops to zero to initiate the end of the read/write cycle, turning off transistor 24 and isolating node 34, then BLm drops back down to zero via the precharge circuitry known in the art, to ready it for the next cycle. Then SLn rises to Vcc again, turning on transistors 140 and 141 and bringing dnm back to ½ Vcc. Throughout the cycle, the shunt line voltage of the deselected cell, i.e. SL(n+1), has remained high, keeping d(n+1)m at ½ Vcc. At power down, Vcc will begin to fall, as will SLn and SL(n+1). As soon as the drop in Vcc is detected, CPn is quickly pulled to zero volts, before Vcc can fall to zero, which pulls dnm and d(n+1)m down to zero. Then Vcc, SLn, and SL(n+1) continue their fall to zero volts.

Figure 10:
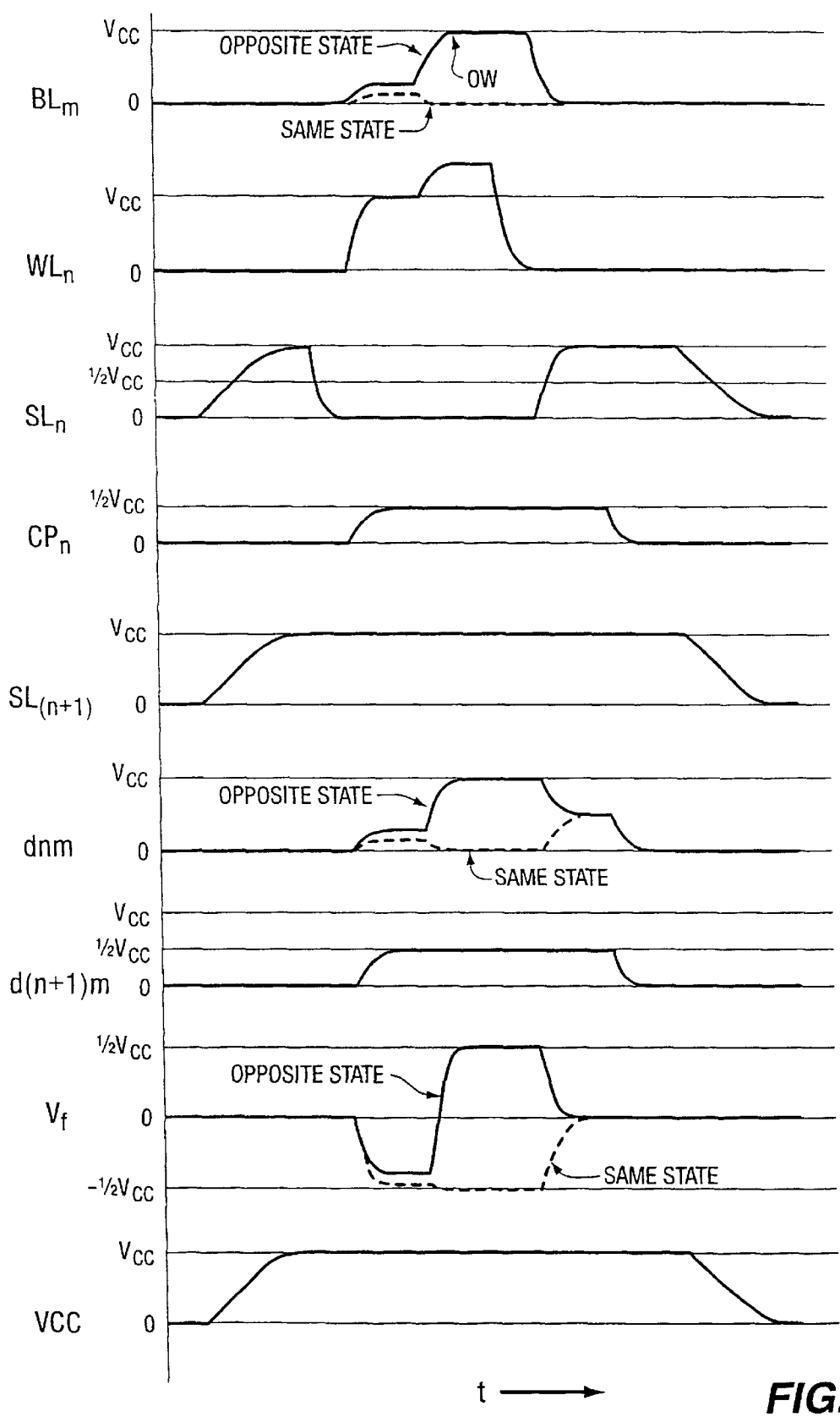
FIG. 10 is a timing diagram showing the voltages developed on the electrical lines and across certain elements of the circuit of FIG. 6 as a function of time when the plate voltage is pulsed one-half the supply voltage.

FIG. 10 is a timing diagram, i.e. a graph of voltage along the ordinate versus time along the abscissa, showing the signals BLm, WLn, SLn, CPn, SL(n+1), dnm, d(n+1)m, Vf, and Vcc for an embodiment of FIG. 6 in which the plate voltage CPn is decoded and pulsed to ½ Vcc. In discussing this timing diagram, we shall again refer to cells 104 and 184, since the other cells operate similarly when their word and bit lines are selected, and cell 104 is selected while cell 184 is deselected. As in the above discussion, the power up and power down cycles are included in the diagram. The principal difference in the timing for this embodiment is that the plate line signal CPn, stays low except in the cycles in which cell 104 is selected, and in that case rises to ½ Vcc only after the shunt line signal SLn drops to zero, and at about the same time as WLn rises. This results in d(n+1)m and dnm staying at zero volts until transistor 24 turns on, when d(n+1)m rises to ½ Vcc in unison with CPn, since SL(n+1) is still high, and dnm rising to essentially the bit line voltage BLm, which as before, depends on the state of the memory cell 104. The response of BLm, dnm and Vf then are the same as in the timing diagram of FIG. 9 until CPn drops to zero following the drop of WLn and the rise of SLn. At this time, both dnm and d(n+1)m respond by dropping to zero in unison with CPn. The power down is straightforward, with SLn and SL(n+1) dropping to zero along with Vcc.

Figure 11:
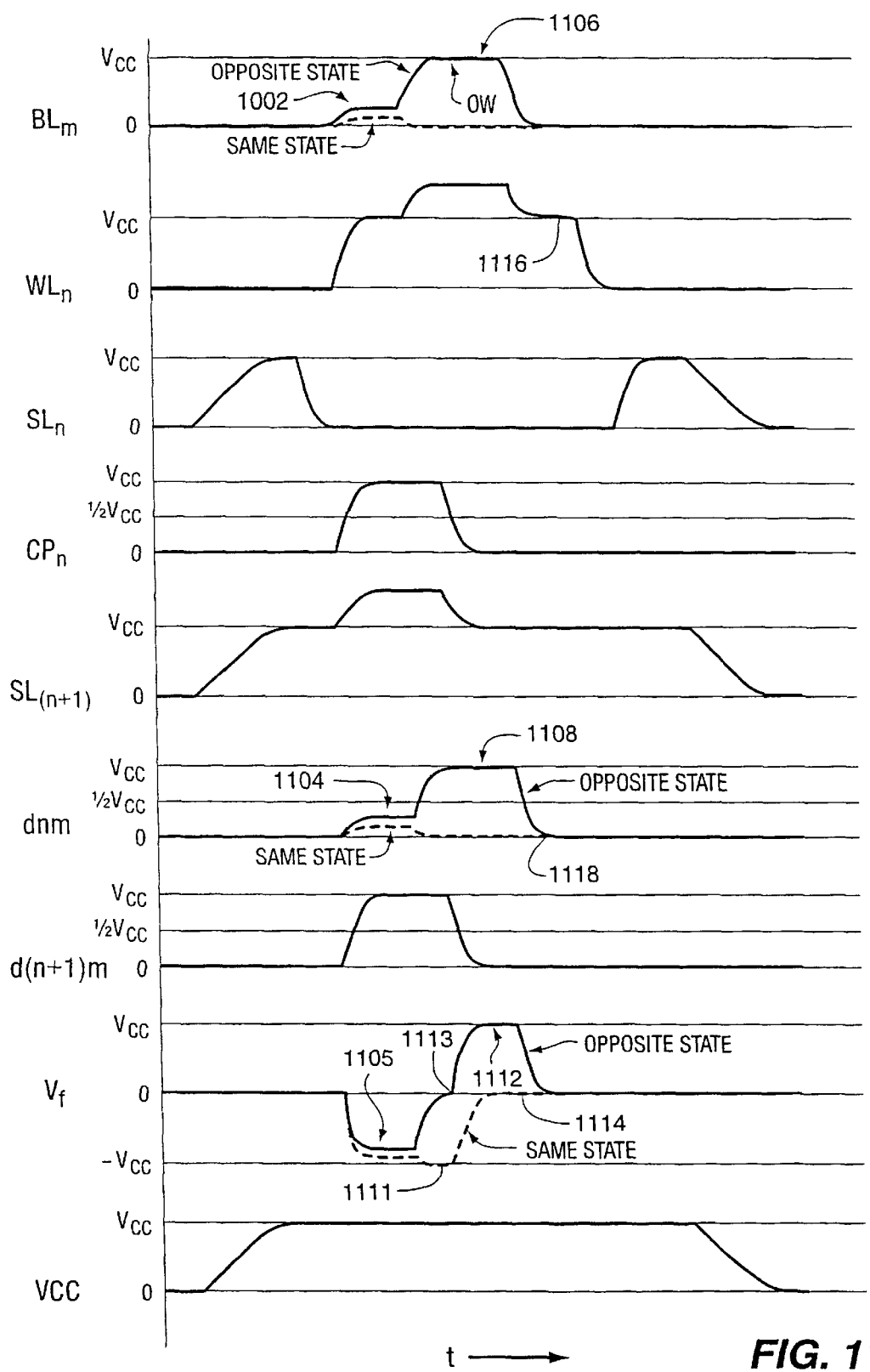
FIG. 11 is a timing diagram showing the voltages developed on the electrical lines and across certain elements of the circuit of FIG. 6 as a function of time when the plate voltage is pulsed the full supply voltage.

FIG. 11 is a timing diagram, i.e. a graph of voltage along the ordinate versus time along the abscissa, showing the signals BLm, WLn, SLn, CPn, SL(n+1), dnm, d(n+1)m, Vf, and Vcc for an embodiment of FIG. 6 in which the plate voltage CPn is decoded and pulsed to Vcc. In discussing this timing diagram, we shall again refer to cells 104 and 184, since the other cells operate similarly when their word and bit lines are selected, and cell 104 is selected and cell 184 is deselected. As in the above discussions, the power up and power down cycles are included in the diagram. The CPn signal is different in both its magnitude and timing for this embodiment as compared to the embodiments of FIGS. 9 and 10. The plate line signal CPn is driven to the full supply voltage, Vcc, after the shunt line signal SLn falls and at about the same time that WLn rises and falls back to zero during the rewrite/write phase while WLn is still at 1.5 Vcc. As a result of CPn going to the full supply voltage, Vcc, the BLm and dnm are up slightly more in their initial rise at 1102 and 1104, respectively, Vf goes to nearly −Vcc in the read pulse 1 105, and d(n+1)m goes to the full supply voltage Vcc. As a result of CPn dropping to zero during the rewrite/write phase, i.e. in the region 1106, 1108 and of the BLm and dnm signals, Vf comes up to Vcc in the rewrite or write pules 1110, and d(n+1)m comes down to zero at the same time. Another result of CPn going to the full supply voltage and coming back down to zero during the rewrite/write phase is that the rewrite/write takes place at a different part of the cycle for the case when the memory cell 108 is in the same state and the case when it is in the opposite state: that is, the rewrite/write takes place in the time region 1111 for the same state, while the rewrite/write takes place in the time region 1112 for the opposite state. Note also that the Vf signal comes back to zero voltage at point 1113 for an instant, due to the fact that both the plate line 32 and the node 34 are at the full Vcc voltage, before climbing to the full Vcc voltage when CPn drops, in the case of the opposite state, and in the case of the same state comes back to zero in the region 1114 since both the node 34 and the plate line 32 are at zero voltage. Another difference in this embodiment is that the SL(n+1) signal is boosted during the portion of the timing cycle that CPn is at the full supply voltage Vcc. This boost ensures that the nodes of the deselected cells rise to the full supply voltage, Vcc. That is, a transistor whose gate is at Vcc, normally has an internal voltage threshold that prevents the full Vcc voltage from being transferred from one source/drain to the other. However, boosting the shunt line permits the full voltage to be transferred. This ensures that the shunt transistors 191 etc. in the deselected cells of the companion row 190 to the selected row 170 are full on and the extra voltage on plate line 32 can be shunted to prevent disturb on the non-selected cells 186 etc. in row 190 by the higher voltage on the plate line 32. A further difference in the embodiment of FIG. 11 is that WLn stays high in region 1116 while the bit line is returned to zero via the precharge circuitry. This brings dnm immediately to zero at the point 1118, rather than going to ½ Vcc as in the previous embodiments. The power down is the same as in FIG. 10.

Figure 12:
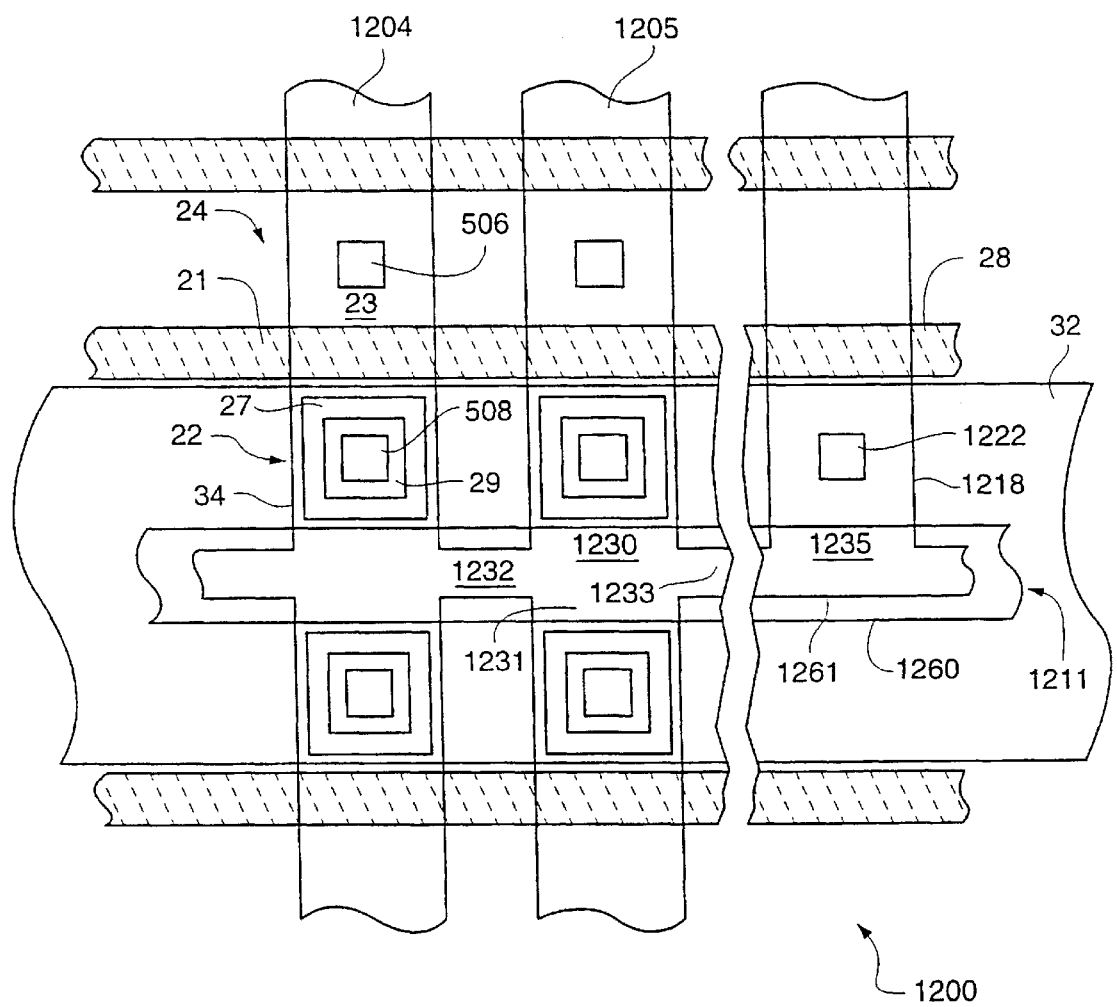
FIG. 12 is an exemplary layout of an integrated circuit memory array utilizing a shared shunt line.
Figure 13:
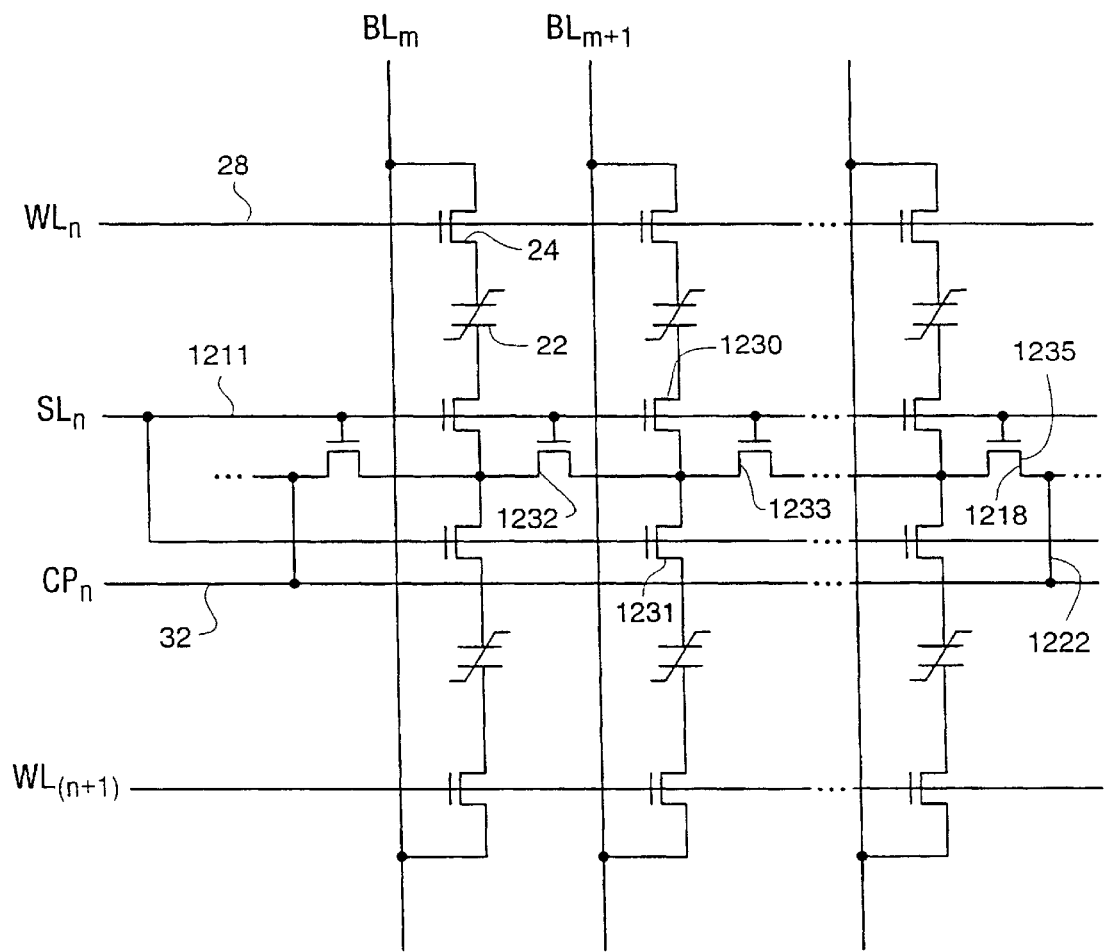
FIG. 13 is an electrical circuit diagram of the memory array of FIG. 12.

FIG. 12 is a layout for a memory cell array 1200 employing a shared shunt line, and FIG. 13 is a circuit diagram for the array. The transistor 24 and capacitor 22 are identical to those in FIG. 5 and the various parts are numbered accordingly. A distributed MOSFET channel 1211 is formed where shunt line 1260 overlies active areas, such as 1261, and in particular where the shunt line 1260 intersects active area portions such as 1232, 1230, 1231, 1233, 1235. As before contact 1222 connects the plate line 32 with source/drain 1218. When shunt line 1260 is at Vcc, the distributed MOSFET 1211 turns on, connecting node 34 and all other corresponding TC nodes to source drain 1218 and, through contact 1222, to plate line 32. This shunt system provides a very compact layout in a fashion similar to that described in connection with the layout of FIG. 5. FIG. 13 shows the equivalent circuit for the layout of FIG. 12, with corresponding portions indicated by corresponding numerals.

Figure 14:
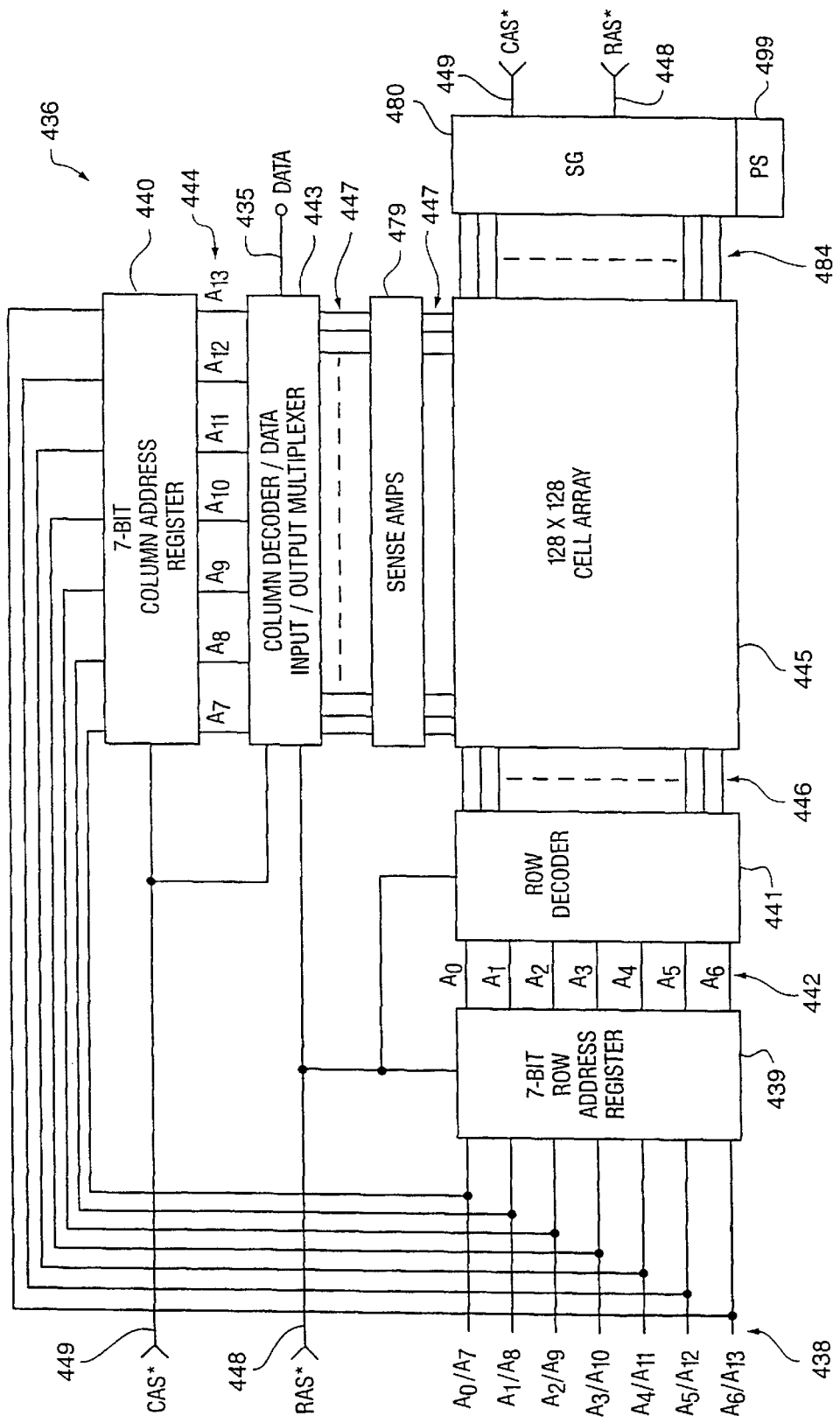
FIG. 14 is an electrical block diagram of an typical integrated circuit memory in which the memory arrays 50, 100, 700, and 1200 according to the invention may be used.

FIG. 14 is a block diagram illustrating an exemplary integrated circuit memory 436 in which memory arrays, such as 50, 100, 700 and 1200, according to the invention are utilized. For simplicity, the embodiment shown is for a 16K×1 FeRAM; however the material may be utilized in a wide variety of sizes and types of memories. In the 16K embodiment shown, there are seven address input lines 438 which connect to a row address register 439 and a column address register 440. The row address register 439 is connected to row decoder 441 via seven lines 442, and the column address register 440 is connected to a column decoder/data input output multiplexer 443 via seven lines 444. The row decoder 441 is connected to a 128×128 memory cell array 445 via 128 lines 446, and the column decoder/data input output multiplexer 443 is connected to the sense amplifiers 479 and memory cell array 445 via 128 lines 447. A signal generator 480 is connected to the array 445 via up to 256 lines 484. As these lines are the shunt and plate lines discussed above, the number of lines depends on which embodiment of the invention discussed above is utilized. For example, if a common plate line is used for all cells and a separate shunt line is used for each row, then only 129 lines 484 would be required. A RAS* signal line 448 is connected to the row address register 439, row decoder 441, column decoder/data input/output multiplexer 443, and signal generator 480, while a CAS* signal line 449 is connected to the column address register 440, column decoder/data input output multiplexer 443, and signal generator 480. (In the discussion herein, * indicates the inverse of a signal.) An input/output data line 435 is connected to the column decoder/data input output multiplexer 443. The memory 436 also includes a power source 499 that provides the nominal output voltage Vcc and other power to signal generator 480 and the rest of the system as required.

Memory cell array 445 contains 128×128=16,384 memory cells, which is conventionally designated as 16K. These cells are ferroelectric switching capacitor-based cells such as 52, 104, or 704. The lines 446 are the word lines, such as 28. The lines 447 which are the bit lines, such as 30.

The operation of the memory in FIG. 14 is as follows. Row address signals $A_0$ through $A_6$ and column address signals $A_7$ through $A_{13}$ placed on lines 438 are multiplexed by address registers 439,4 40 utilizing the RAS* and CAS* signals, and passed to the row decoder 441 and column decoder/data input/output multiplexer 443, respectively. The row decoder 441 places the word line signals, such as the WLn signals discussed above on the one of the word lines 446; generally a signal is placed on the word line of the cell that is addressed. The column decoder/data input output multiplexer 443 either places the data signal which is input on line 435 on the one of the bit lines 447 corresponding to the column address, or outputs on the data line 435 the signal on the one of the bit lines 447 corresponding to the column address, depending on whether the function is a write or read function. This is the bit line signal, such as the BLm signal discussed above. As is known in the art, the read function is triggered when the RAS* signal precedes the CAS* signal, and the write function is triggered when the CAS* signal comes before the RAS* signal. As is well-known in the art, the sense amplifiers 79 are located along lines 47 to amplify the signals on the lines. The shunt line and plate line signals, such as SLn and CPn signals discussed above, are produced by signal generator 480 based on the CAS* and RAS* signals and an internal chip clock. Thus, signal generator 480 forms part of shunt systems 11, 101, and 701. In some memories the signal generator 480 and row decoder 441 may be combined into a single signal generation unit. The circuitry of the row decoder 441 and signal generator 480 includes all circuitry required to produce the word line, shunt line, and plate line signals discussed above, including the boosted signals. This circuitry is known in the art of integrated circuit memory design, and will not be further discussed herein. Other logic required or useful to carry out the functions outlined above as well as other known memory functions is also included in the memory 436 but is not shown or discussed as it is not directly applicable to the invention.

There has been described novel integrated circuit memories, memory arrays, and memory cells, as well as novel methods of memory operation. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it has been shown that a memory using a shunt line and shunt process solves the problems associated with reading a ferroelectric memory cell in a relatively simple and economical manner, and has many other advantages, other memories utilizing other embodiments of a shunt system may be designed. For example, it is know to use switches other than transistors in a ferroelectric memory. See, for example, U.S. Pat. No. 2,876,436 which describes a memory which is the same as the "1T/1C" of FIG. 1, without the shunt 26, except a diode is used as a switch instead of a transistor. The shunt 26 will perform the same function in such a memory. Further, it is known to use a memory element other than a capacitor as the ferroelectric element in a memory. For example, U.S. Pat. No. 5,523,964 issued to Larry D. McMillan et al. on Jun. 4, 1996 and U.S. Pat. No. 5,541,870 issued to Takashi Mihara et al. on Jul. 30, 1996 both show the use of a ferroelectric FET as the memory element in a ferroelectric memory. In both these patents, one or more transistors are used to address either the gate of the FET or the source and drain of the FET, which transistors create isolated nodes for which the shunt system disclosed herein will prevent disturb problems. Similarly, other features may be added, and equivalent parts may be substituted for those described herein.

I claim:

1. A ferroelectric memory comprising: a switch; and a ferroelectric memory element having a first electrode; said first electrode connected to said switch to create a node that is isolated when said switch is off; said ferroelectric memory including two of said isolated nodes, characterized by a shunt system including a shunt device for directly electrically connecting said two isolated nodes during a predetermined time.

2. A ferroelectric memory as in claim 1 characterized in that said shunt device is selected from the group consisting of: a Schottky diode, a resistor, and a pair of back-to-back diodes.

3. A ferroelectric memory as in claim 1 characterized in that said shunt system comprises a shunt transistor.

4. A ferroelectric memory as in claim 3 wherein said memory includes a supply voltage power source having an output voltage, said shunt transistor includes a gate, and characterized in that said shunt system includes:

a shunt line connected to the gate of said shunt transistor; and a signal generator for applying a shunt line signal to said shunt line, which signal is boosted above the voltage of said output voltage for at least a portion of said predetermined time.

5. A ferroelectric memory as in claim 3 wherein said memory includes a capacitor having said first electrode and a second electrode, and said memory further comprises a plate line for providing a voltage signal to said second electrode of said capacitor, said memory further characterized in that said shunt system comprises a shunt device for directly electrically connecting one of said isolated nodes and said plate line.

6. A ferroelectric memory as in claim 5 wherein said transistor includes a transistor gate, said transistor and capacitor are part of a memory cell in said memory, said memory includes a plurality of said memory cells and a plurality of word lines connected to said gates of said transistors in said memory cells, and said memory further characterized in that said predetermined time includes essentially all of the cycles of said memory in which the word line connected to said first memory cell is not selected.

7. A ferroelectric memory as in claim 1 wherein said memory includes a capacitor having said first electrode and a second electrode, and said memory further comprises a plate line for providing a voltage signal to said second electrode of said capacitor, and said memory further characterized in that said shunt system comprises a shunt device for directly electrically connecting one of said isolated nodes and said plate line.

8. A ferroelectric memory as in claim 1 wherein: said switches comprise a first transistor having a first source/drain and a second transistor having a second source/drain; said first electrodes being one electrode of a first capacitor having a first pair of electrodes and one electrode of a second capacitor having a second pair of electrodes; and wherein one of said first pair of electrodes is connected to said first source/drain of said first transistor to create said first isolated node that is isolated when said first transistor is off, and one of said second pair of electrodes is connected to said second source/drain of said second transistor to create said second isolated node that is isolated when said second transistor is off; said memory further characterized in that said shunt system comprises a device for directly electrically connecting said first isolated node and said second isolated node to essentially equalize the voltages on said nodes.

9. A ferroelectric memory as in claim 1 wherein said memory includes a plurality of memory cells, each of said memory cells including one of said isolated nodes, and said memory further characterized in that said shunt system comprises:
   a first shunt device for directly electrically connecting said one of said isolated nodes in each of said cells to one of said isolated nodes in another of one of said cells during said predetermined time; and
   a second shunt device for directly electrically connecting at least one of said isolated nodes to said second electrode of said memory element during said predetermined time.

10. A ferroelectric memory as in claim 9 characterized in that there is one of said second shunt devices for every $2^n$ of said memory cells, where n is an integer from zero to ten.

11. A ferroelectric memory as in claim 9 characterized in that there is one of said second shunt devices for every eight to thirty-two of said memory cells.

12. A method of operating a ferroelectric memory including a memory cell comprising a switch and a ferroelectric memory element having a first electrode, said first electrode connected to said switch to create a node that is isolated when said switch is off, said memory including two of said isolated nodes, said method characterized by the step of directly electrically connecting said isolated nodes during a predetermined time.

13. A method as in claim 12 wherein said ferroelectric memory element includes a second electrode, and said method further including the step of directly electrically connecting at least one of said isolated nodes to its corresponding second electrode during said predetermined time.

14. A method as in claim 12 wherein said switch comprises a transistor having a first source/drain, a second source drain, and a gate, and said ferroelectric memory element comprises a ferroelectric capacitor having said first electrode and a second electrode, with said first electrode connected to said first source/drain of said transistor to create said isolated node when said transistor is off, and said memory further includes a bit line, a word line, and a plate line, said bit line is connected to said second source/drain, said word line is connected to said gate, and said plate line is connected to said second electrode, and said method is further characterized by the steps of:
   performing a write/rewrite cycle on said memory cell, including the step of raising the voltage on said word line; and, at the end of said write/rewrite cycle, adjusting the voltage on said bit line to the same voltage as the voltage on said plate line.

15. A method as in claim 13 wherein said memory includes a supply voltage power source having an output voltage, a shunt transistor including a gate, and a shunt line connected to the gate of said shunt transistor, said method further including the step of applying a voltage to said shunt line that is higher than said output voltage.

16. A method as in claim 12 wherein said memory includes a supply voltage power source having an output voltage, a shunt transistor including a gate, and a shunt line connected to the gate of said shunt transistor, said method further including the step of applying a voltage to said shunt line that is higher than said output voltage.

17. A method of operating a ferroelectric memory cell as in claim 12 wherein said switches comprise a first transistor having a first source/drain and a second transistor having a second source/drain, said first electrodes being an electrode of a first capacitor having a first pair of electrodes and an electrode of a second capacitor having a second pair of electrodes, wherein one of said first pair of electrodes is connected to said first source/drain of said first transistor to create a first said node that is isolated when said first transistor is off, and one of said second pair of electrodes is connected to said second source/drain of said second transistor to create a second said node that is isolated when said second transistor is off, characterized in that said step of directly electrically connecting comprises connecting said first isolated node and said second isolated node during said predetermined time to essentially equalize the voltages on said nodes.

* * * * *